US012666668B2

(12) United States Patent
Hsieh et al.

(10) Patent No.: US 12,666,668 B2
(45) Date of Patent: Jun. 23, 2026

(54) SEMICONDUCTOR DEVICES WITH BONDING LAYERS

(71) Applicant: TAIWAN SEMICONDUCTOR MANUFACTURING COMPANY, LTD., Hsinchu (TW)

(72) Inventors: Wan Chen Hsieh, Hsinchu City (TW); Zhen-Cheng Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 389 days.

(21) Appl. No.: 18/348,081

(22) Filed: Jul. 6, 2023

(65) Prior Publication Data

US 2025/0015131 A1     Jan. 9, 2025

(51) Int. Cl.

| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 64/01* | (2025.01) |
| *H10D 84/01* | (2026.01) |
| *H10D 84/03* | (2025.01) |
| *H10P 14/60* | (2026.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01);

*H10D 64/017* (2025.01); *H10D 84/0144* (2025.01); *H10D 84/038* (2025.01); *H10P 14/6336* (2026.01)

(58) Field of Classification Search
CPC .... H10D 62/121; H10D 30/014; H10D 30/43; H10D 30/6735; H10D 30/6757; H10D 64/017; H10D 84/0144; H10D 84/038; H10P 14/6336
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

*Primary Examiner* — Jay C Kim
*Assistant Examiner* — Woo K Lee
(74) *Attorney, Agent, or Firm* — Maschoff Brennan

(57) ABSTRACT

A method includes the following steps. A transistor including a first gate structure is formed on a first substrate. A first dielectric layer is deposited over the transistor using plasma enhanced atomic layer deposition (PEALD). A multilayer stack is formed on a second substrate. The multilayer stack comprises alternately stacked semiconductor layers and sacrificial layers. A second dielectric layer is deposited over the multilayer stack using a plasma enhanced atomic layer deposition (PEALD). The second dielectric layer is bonded with the first dielectric layer. The sacrificial layers are replaced with a second gate structure.

20 Claims, 53 Drawing Sheets 108
106
102

SEMICONDUCTOR DEVICES WITH BONDING LAYERS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed. GaInAs, GaInP, and/or GaInAsP; or combinations thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A and 12A are perspective views of manufacturing first semiconductor device in accordance with some embodiments.

FIGS. 1B, 2B, 3B, 4B, 5B, 6B, 7B, 8B, 9B, 10B, 11B and 12B are cross-sectional views along line B-B of FIGS. 1A, 2A, 3A, 4A, 5A, 6A, 7A, 8A, 9A, 10A, 11A and 12A, respectively.

DETAILED DESCRIPTION

Figures 1A, 1B:
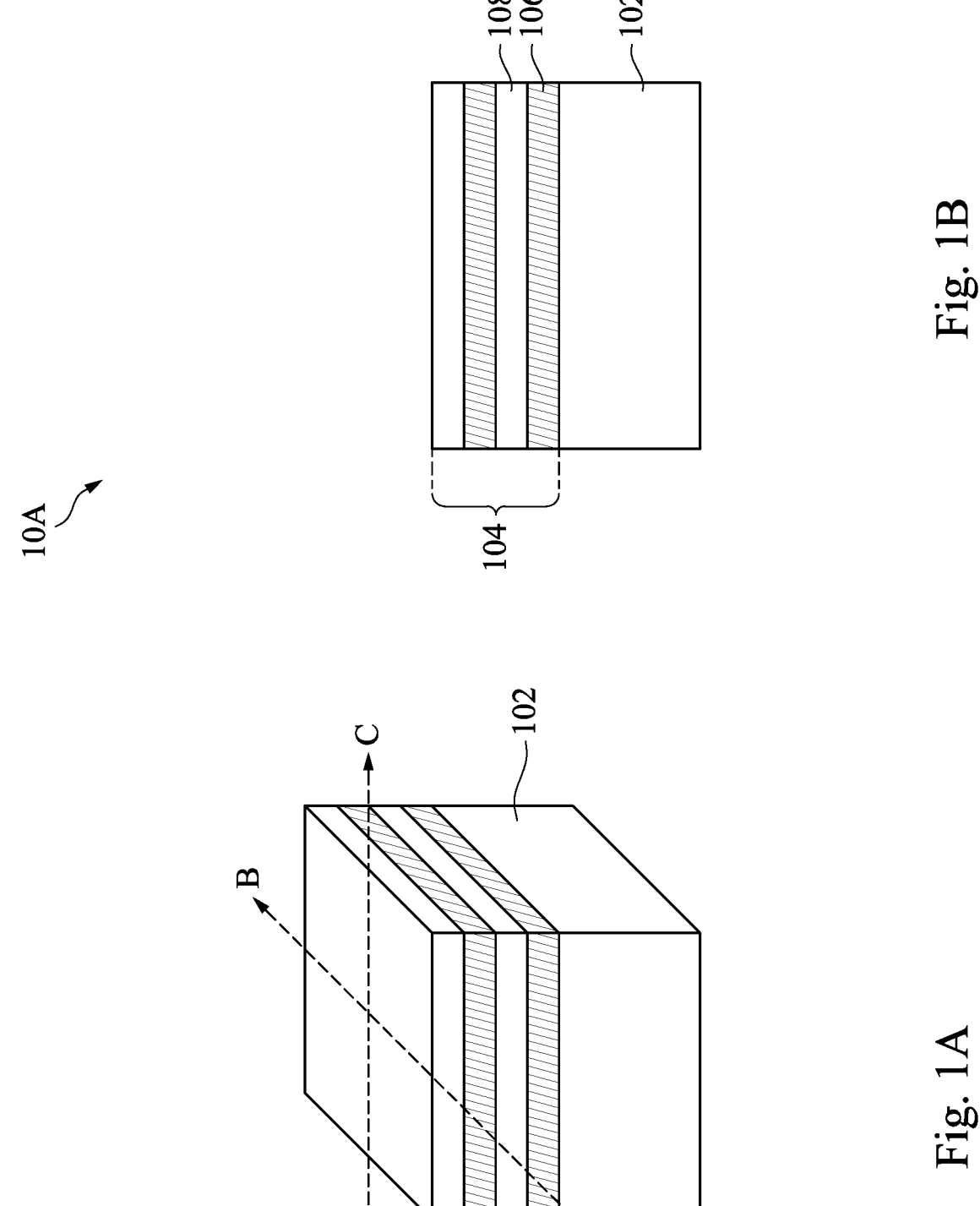

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

Stacked transistor structures, such as complementary field effect transistors (CFETs) including vertically stacked p-type FETs and n-type FETs, can provide further reduced footprint and density improvement for advanced IC technology nodes (particularly as IC technology nodes advance to 3 nm (N3) and below). Sequential CFET structure can be formed by, for example, forming bottom transistors on a first substrate, forming a first bonding layer over the bottom transistors, forming a second bonding layer on an epitaxial stack, bonding the second bonding layer to the first bonding layer, followed by forming top transistors on the epitaxial stack. The bonding layers may be formed by flowable chemical vapor deposition (FCVD), and additional processes such as a UV curing or high temperature annealing may be performed to successfully bond the bonding layers. However, the additional processes may lead to oxidation in one or more semiconductor layers of the epitaxial stack and inter-diffusion of different layers in the epitaxial stack.

Embodiments of the present disclosure provides a solution to these challenges by forming the bonding layers using plasma enhanced atomic layer deposition (PEALD) and performing a surface plasma treatment on the bonding layers. The PEALD process and surface plasma treatment can be performed at lower temperatures than the FCVD process, which in turn prevents unwanted oxidation and inter-diffusion caused by the FCVD process.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-25C show various stages of manufacturing operations for a semiconductor device according to some embodiments of the present disclosure. In greater details, the semiconductor device discussed in FIGS. 1A-25C is a complementary FET (CFET). Generally, a CFET includes a second transistor (e.g., the second semiconductor device 10B in FIGS. 25A-25C) vertically stacked over a first transistor (e.g., the first semiconductor device 10A in FIGS. 25A-25C), in which the first and second transistors include different conductivity types. For example, the first transistor and the second transistor may be n-type transistor and p-type transistor, respectively. Alternatively, the first transistor and the second transistor may be p-type transistor and n-type transistor, respectively. FIGS. 1A-12D are schematic views of manufacturing the first semiconductor device 10A (or first transistor) in accordance with some embodiments.

FIGS. 1A, 2A, 3A, 4A, 5A, 6A, 7A, 8A, 9A, 10A and 11A are perspective views of manufacturing a first semiconductor device 10A in accordance with some embodiments. FIGS. 1B, 2B, 3B, 4B, 5B, 6B, 7B, 8B, 9B, 10B and 11B are cross-sectional views along line B-B of FIGS. 1A, 2A, 3A, 4A, 5A, 6A, 7A, 8A, 9A, 10A and 11A, respectively. FIGS. 1C, 2C, 3C, 4C, 5C, 6C, 7C, 8C, 9C, 10C and 11C are cross-sectional views along line C-C of FIGS. 1A, 2A, 3A, 4A, 5A, 6A, 7A, 8A, 9A, 10A and 11A, respectively. FIGS. 4D, 5D, 6D, 7D, 8D, 9D, 10D and 11D are cross-sectional views along line D-D of FIGS. 4A, 5A, 6A, 7A, 8A, 9A, 10A and 11A, respectively.

Figure 1C:
FIGS. 1C, 2C, 3C, 4C, 5C, 6C, 7C, 8C, 9C, 10C, 11C and 12C are cross-sectional views along line C-C of FIGS. 1A, 2A, 3A, 4A, 5A, 6A, 7A, 8A, 9A, 10A, 11A, and 12A respectively.
Figure 1C:
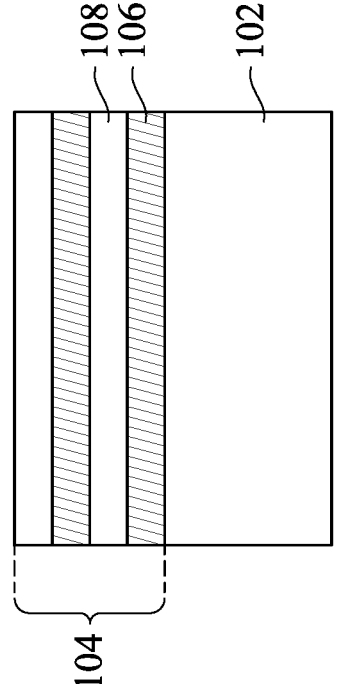

Reference is made to FIGS. 1A-1C. A substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 102 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multilayer stack 104 is formed on the substrate 102. The multilayer stack 104 includes first sacrificial layers 106 and first semiconductor layers 108 alternately deposited over the substrate 102. In some embodiments, the first sacrificial layers 106 may be made of a semiconductor material, and thus can also be referred to as semiconductor layers. The number of first sacrificial layers 106 and first semiconductor layers 108 illustrated in FIGS. 1A-1C are merely non-limiting examples. Other numbers of layers are also possible and are fully intended to be included within the scope of the present disclosure.

In some embodiments, the first sacrificial layers 106 include silicon germanium ($Si_xGe_{1-x}$, where x can be in the range of 0 to 1). The first semiconductor layers 108 include an epitaxial material. The multilayer stacks 104 (may also be referred to as an epitaxial material stack) will be patterned to form channel regions of a p-type sheet field effect transistor (PSFET) in subsequent processing. In particular, the multilayer stack 104 will be patterned to form horizontal nanosheets, with the channel regions of the resulting PSFET including multiple horizontal nanosheets.

The multilayer stack 104 may be formed by an epitaxial growth process, which may be performed in a growth chamber. During the epitaxial growth process, the growth chamber is cyclically exposed to a first set of precursors for selectively growing the first sacrificial layers 106, and then exposed to a second set of precursors for selectively growing the first semiconductor layers 108, in some embodiments. The first set of precursors includes precursors for the first sacrificial layers (e.g., silicon germanium), and the second set of precursors includes precursors for the first semiconductor layers. In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first sacrificial layers 106; and (2) disabling the flow of the germanium precursor to the growth chamber when growing the first semiconductor layers 108. The cyclical exposure may be repeated until a target quantity of layers is formed.

Figures 2A, 2B:
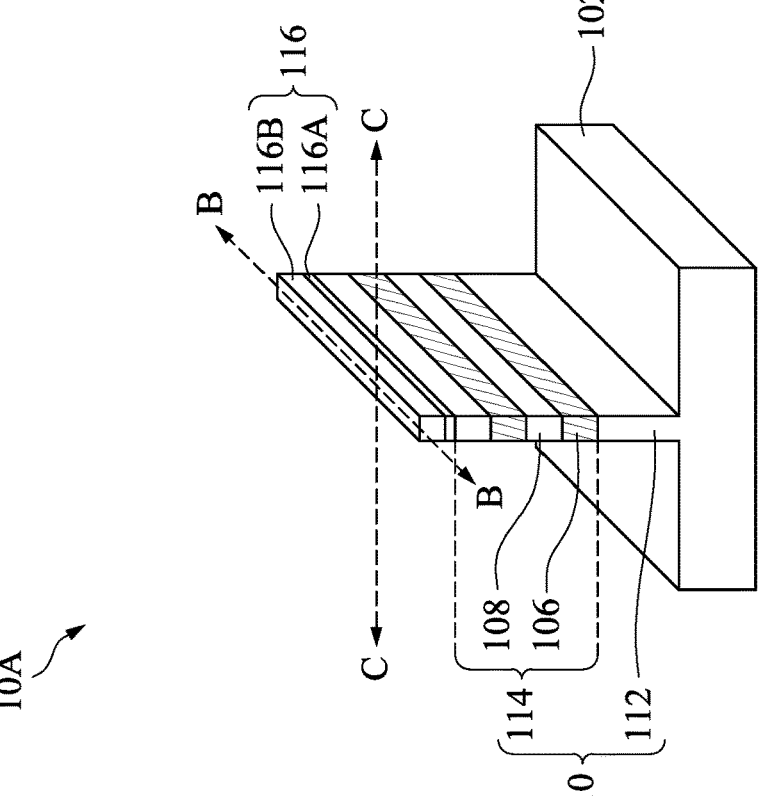
Figure 2C:
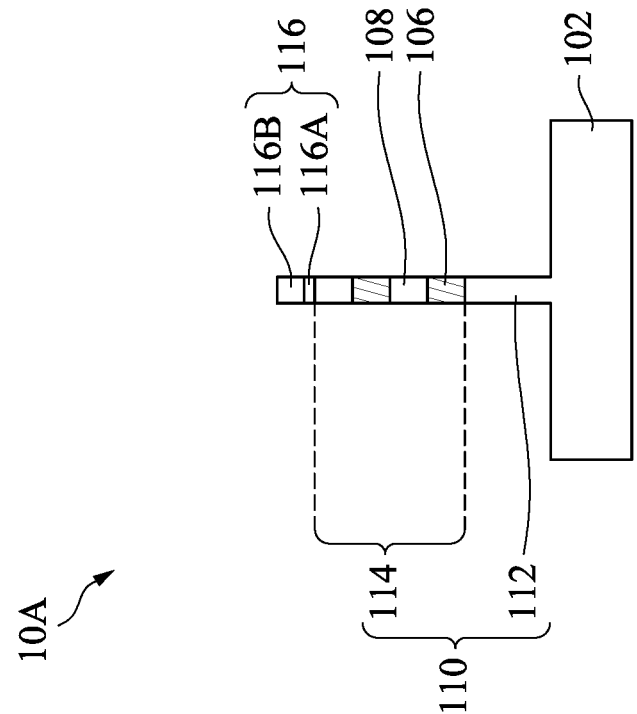

Reference is made to FIGS. 2A-2C. Fin structure 110 is formed protruding above the substrate 102. The fin structure 110 includes a semiconductor fin 112 and a nanostructure 114 overlying the semiconductor fin 112. The nanostructure 114 and the semiconductor fin 112 may be formed by etching trenches in the multilayer stack 104 and the substrate 102, respectively.

The fin structure 110 may be patterned by any suitable method. For example, the fin structure 110 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 110.

In some embodiments, the remaining spacers are used to pattern a mask 116, which is then used to pattern the fin structure 110. The mask 116 may be a single layer mask, or may be a multilayer mask such as a multilayer mask that includes a first mask layer 116A and a second mask layer 116B. The first mask layer 116A and second mask layer 116B may each be formed from a dielectric material such as silicon oxide, silicon nitride, a combination thereof, or the like, and may be deposited or thermally grown according to suitable techniques. The first mask layer 116A and second mask layer 116B are different materials having a high etching selectivity. For example, the first mask layer 116A may be silicon oxide, and the second mask layer 116B may be silicon nitride. The mask 116 may be formed by patterning the first mask layer 116A and the second mask layer 116B using any acceptable etching process. The mask 116 may then be used as an etching mask to etch the substrate 102 and the multilayer stack 104. The etching may be any acceptable etch process, such as a reactive ion etch (RIE), neutral beam etch (NBE), the like, or a combination thereof. The etching is an anisotropic etching process, in some embodiments. After the etching process, the patterned multilayer stack 104 form the nanostructure 114, and the patterned substrate 102 form the semiconductor fin 112, as illustrated in FIGS. 2A-2C. Therefore, in the illustrated embodiment, the nanostructure 114 also includes alternating layers of the first sacrificial layers 106 and the first semiconductor layers 108, and the semiconductor fin 112 is formed of a same material (e.g., silicon) as the substrate 102.

Figures 3A, 3B:
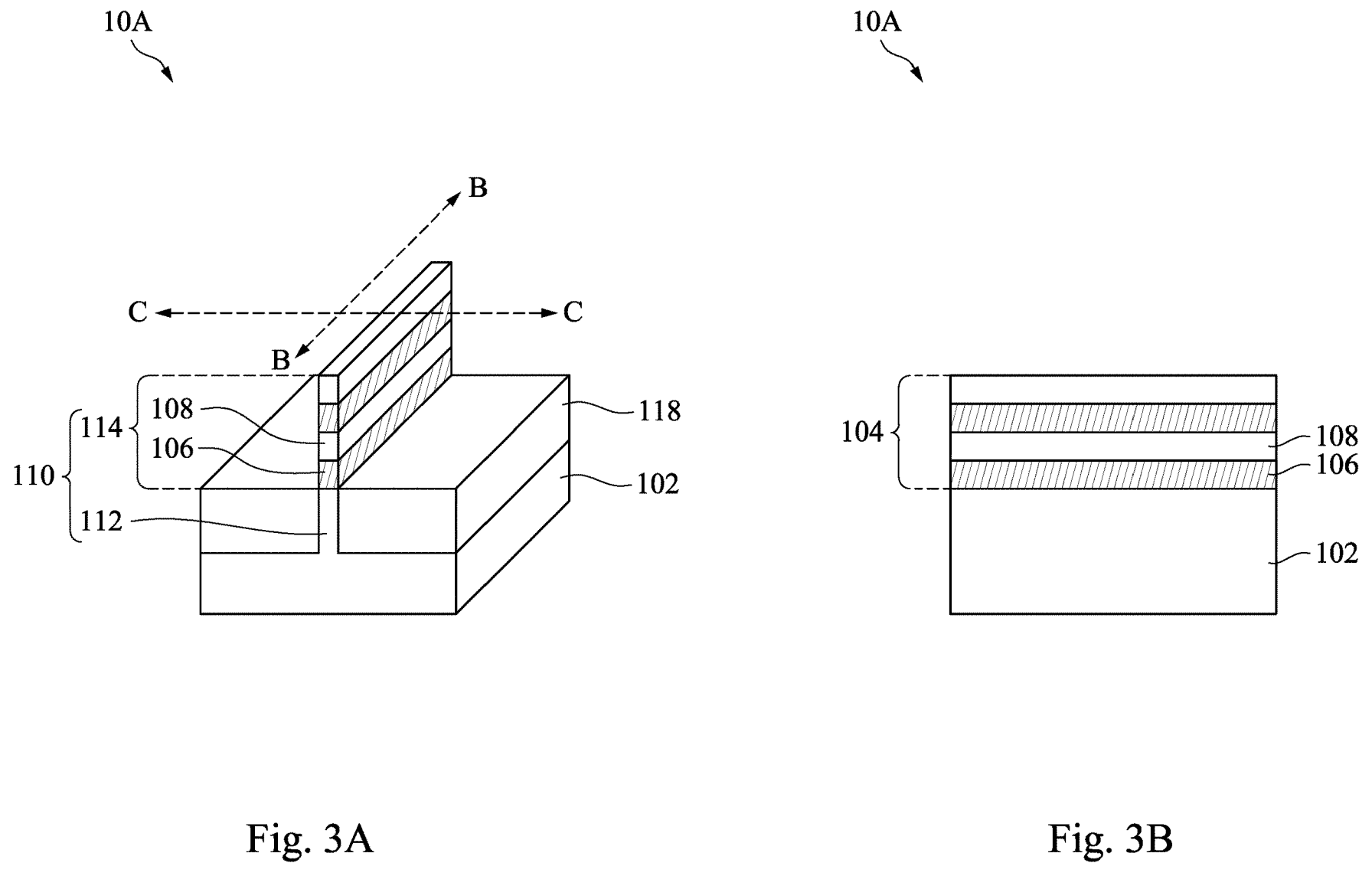
Figure 3C:
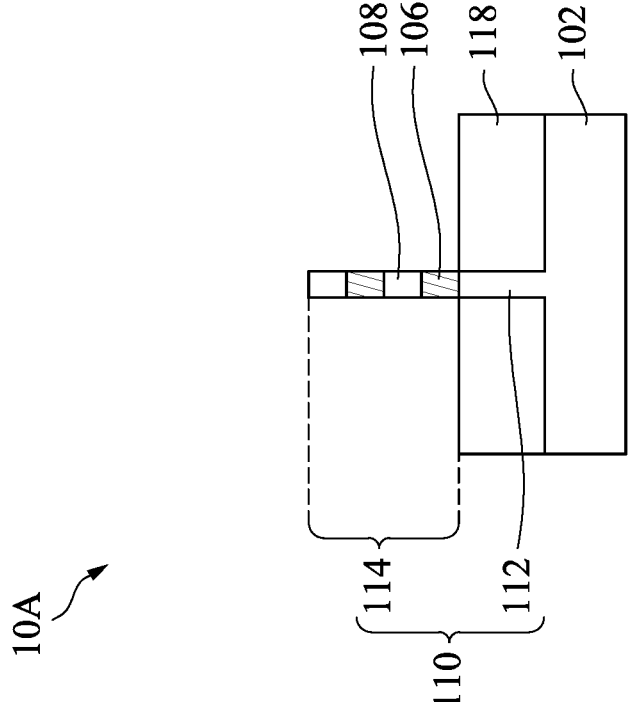
Figure 4D:
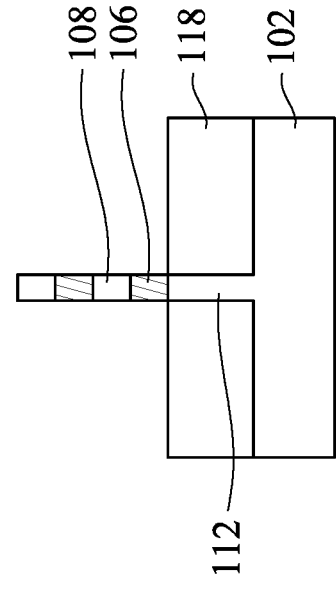
FIGS. 4D, 5D, 6D, 7D, 8D, 9D, 10D, 11D and 12D are cross-sectional views along line D-D of FIGS. 4A, 5A, 6A, 7A, 8A, 9A, 10A and 11A, respectively.
Figure 4C:
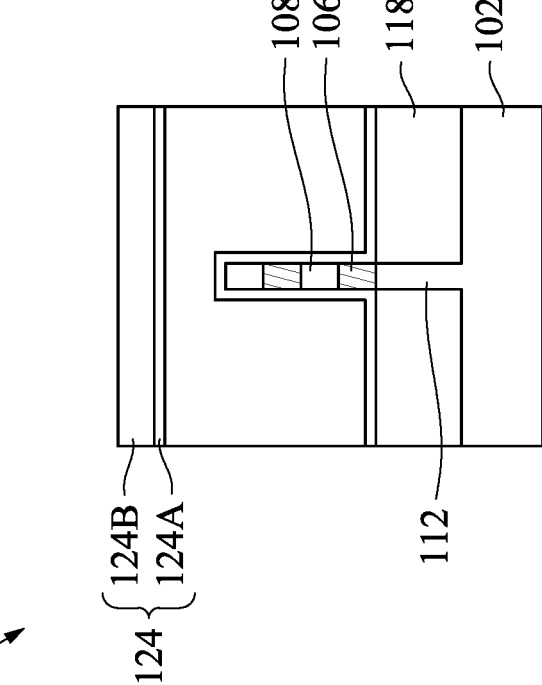
Figure 5D:
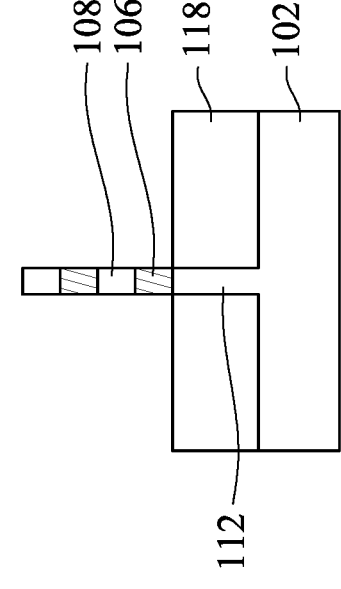
Figure 5C:
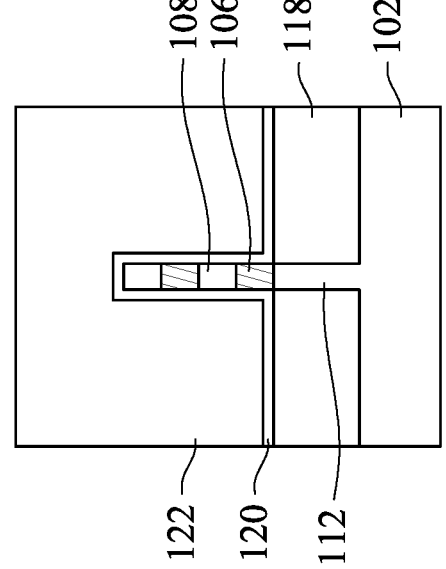
Figure 6B:
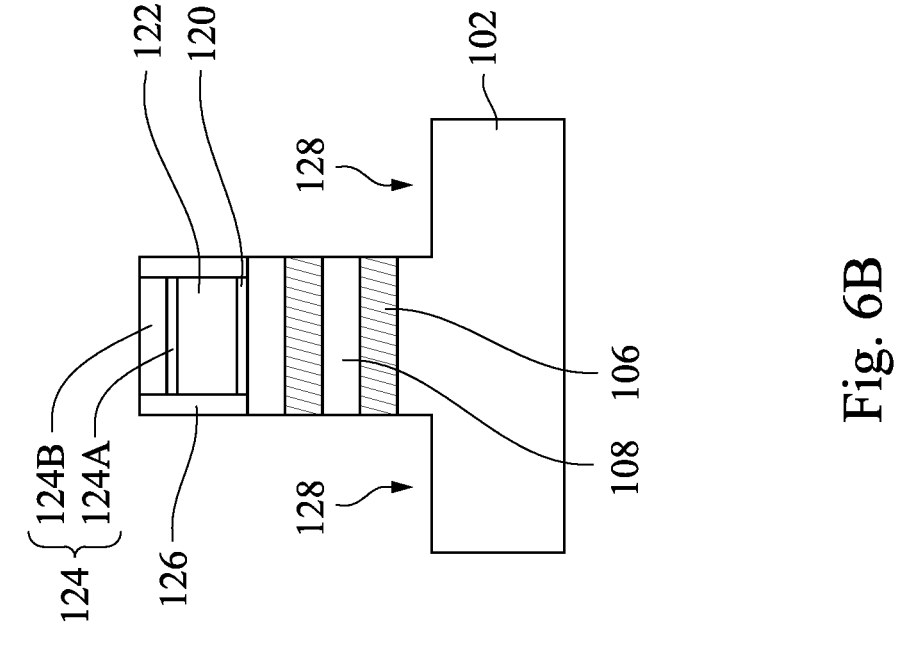
Figure 6A:
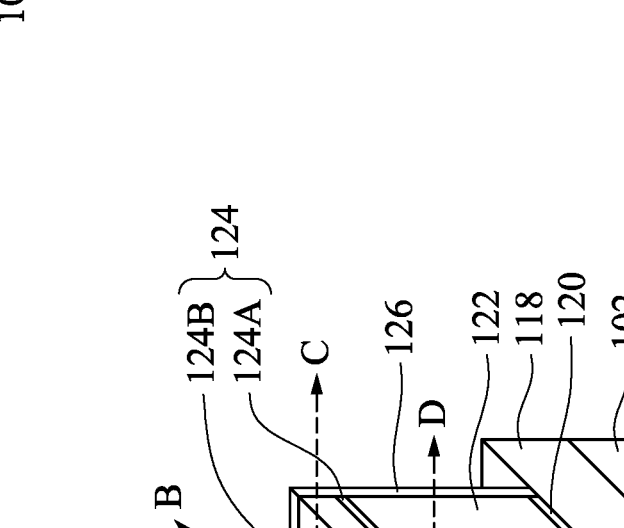
Figure 6A:
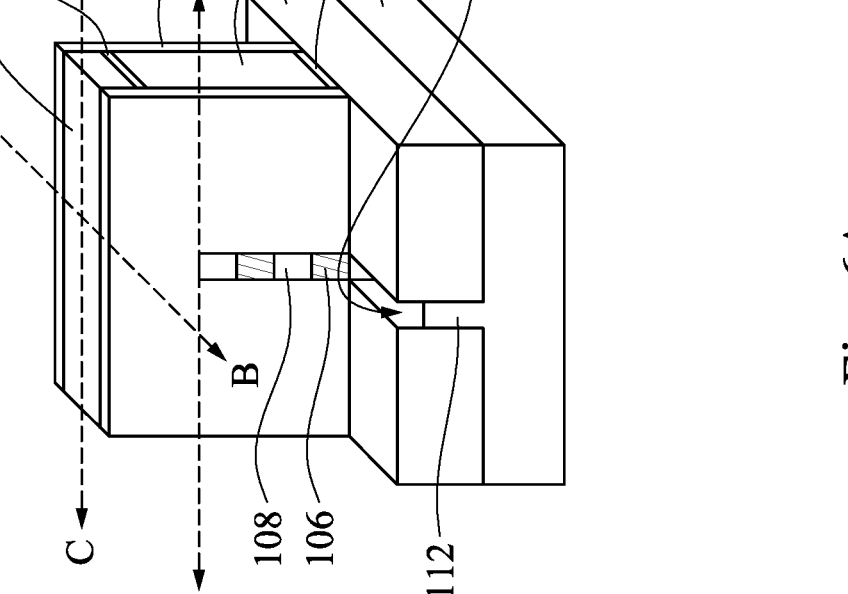
Figure 6D:
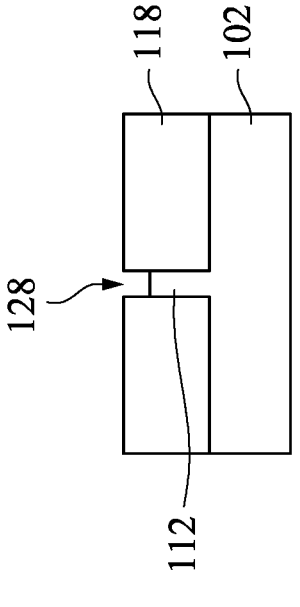
Figure 6C:
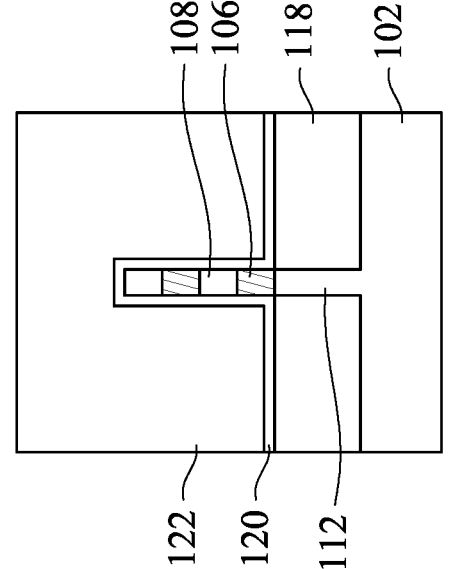
Figure 7B:
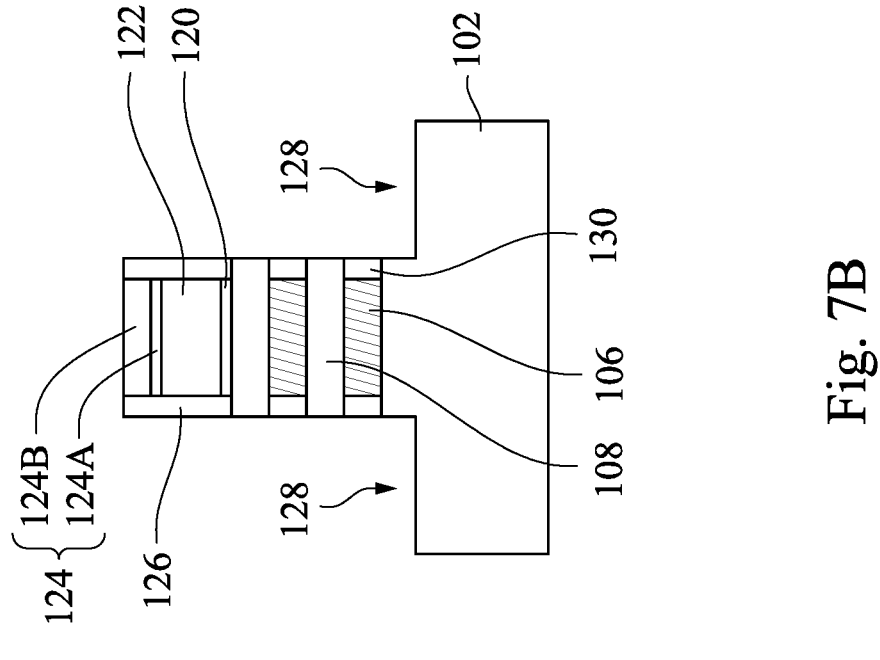
Figure 7A:
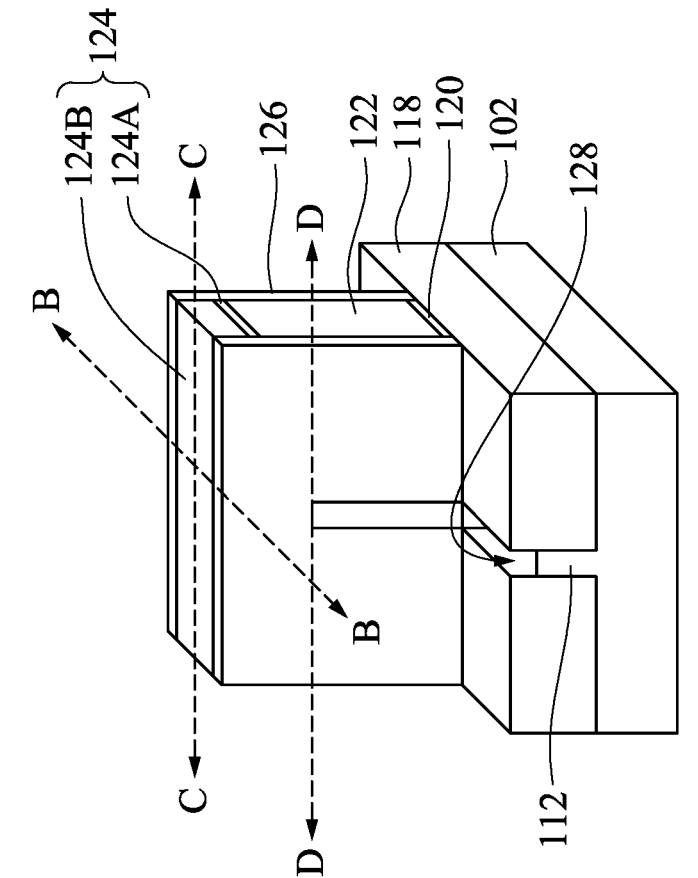
Figure 7D:
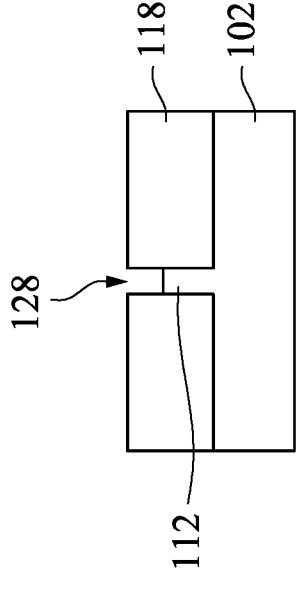
Figure 7C:
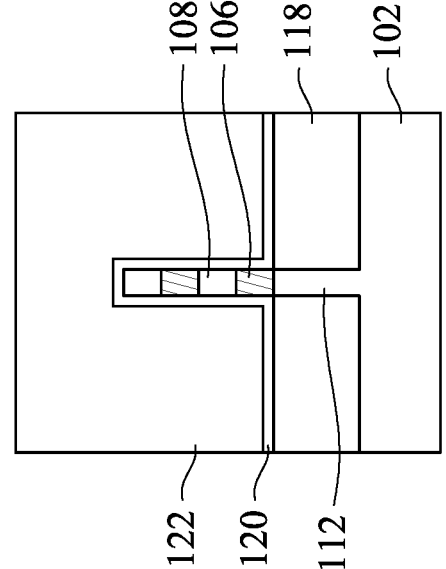
Figure 8B:
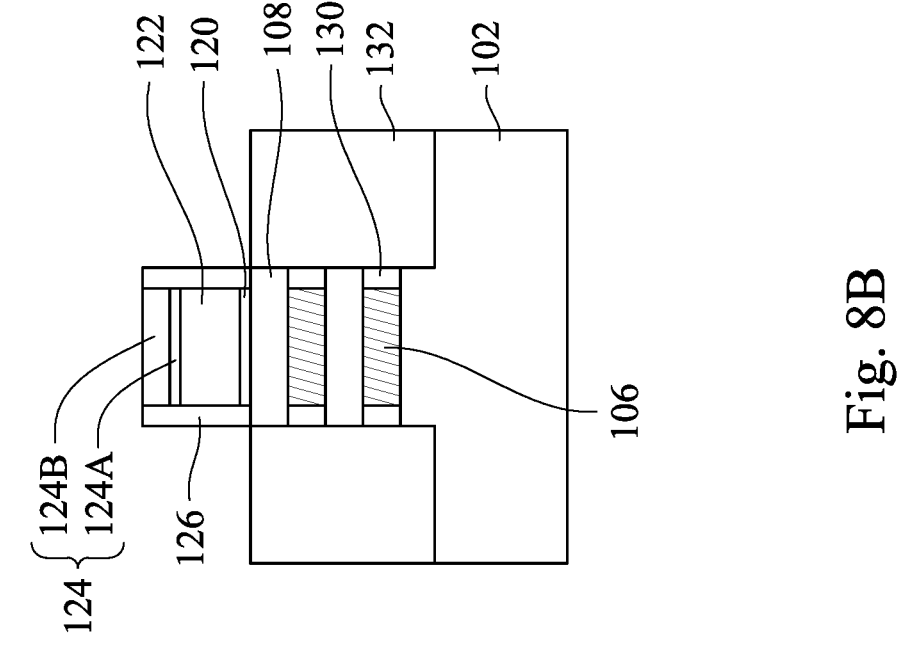
Figure 8A:
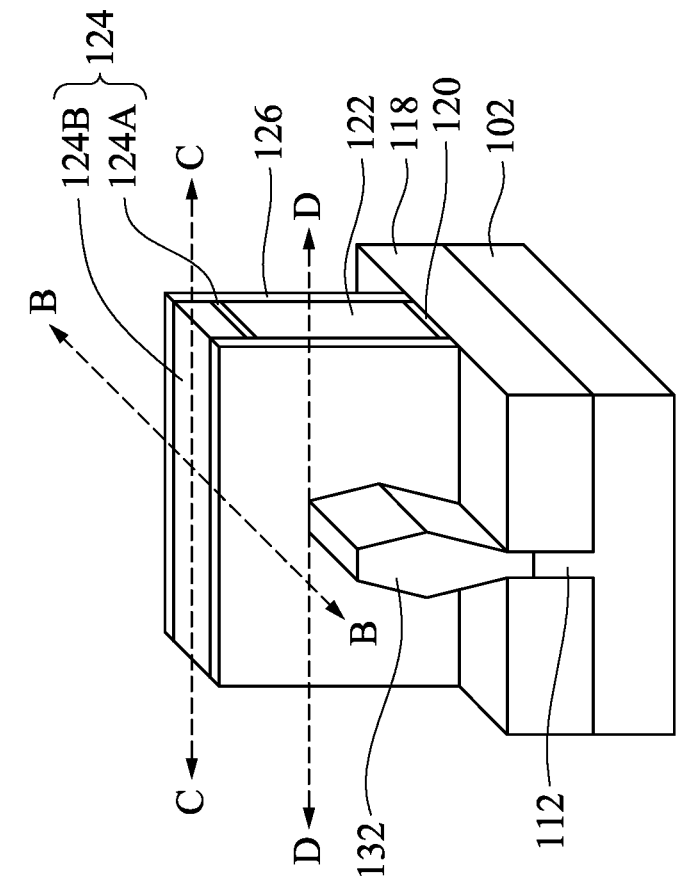
Figure 8D:
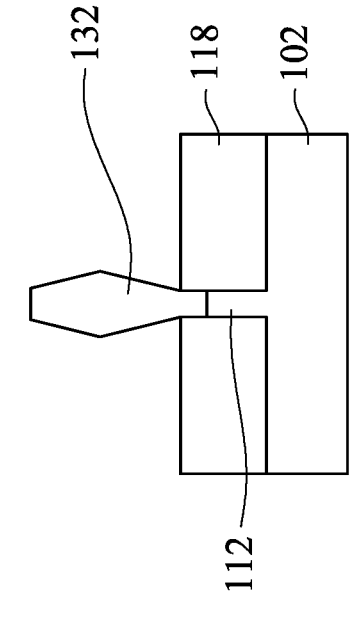
Figure 8C:
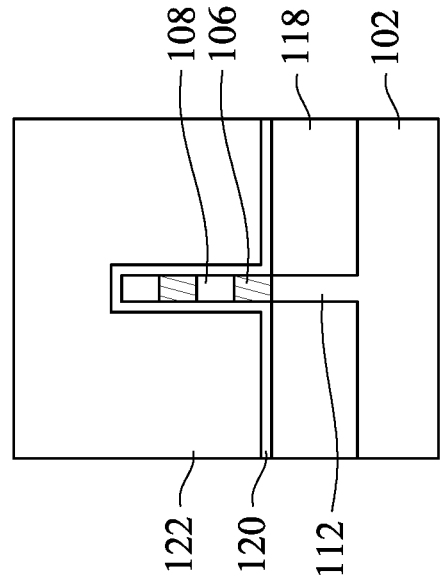
Figure 9B:
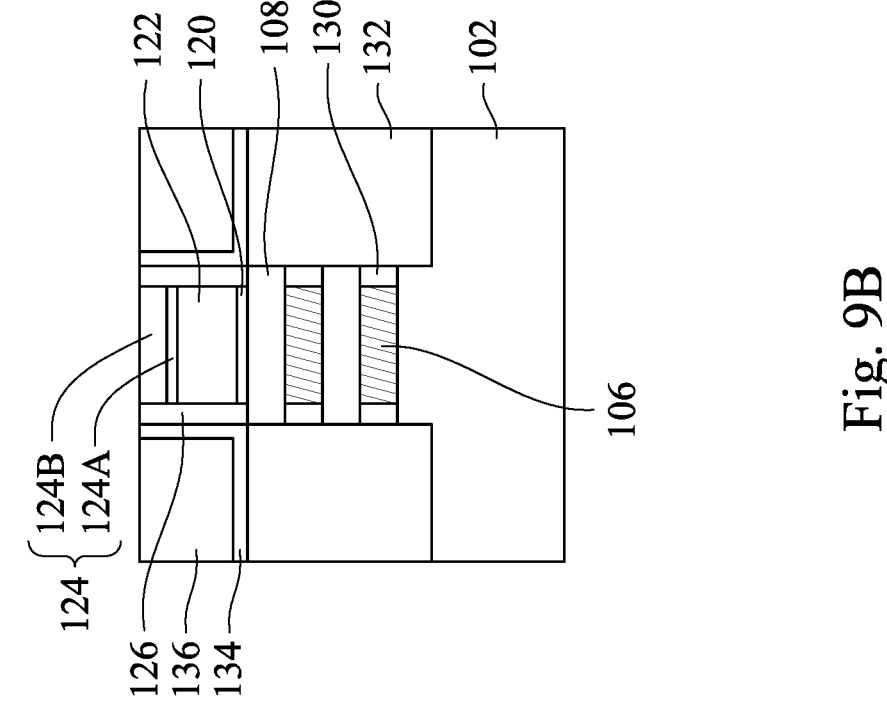
Figure 9A:
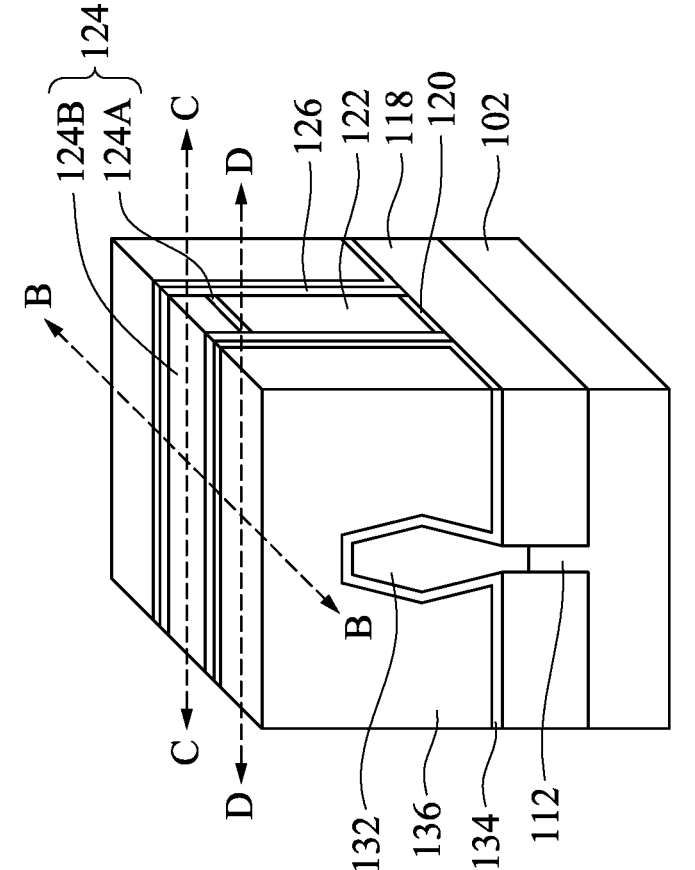
Figure 9D:
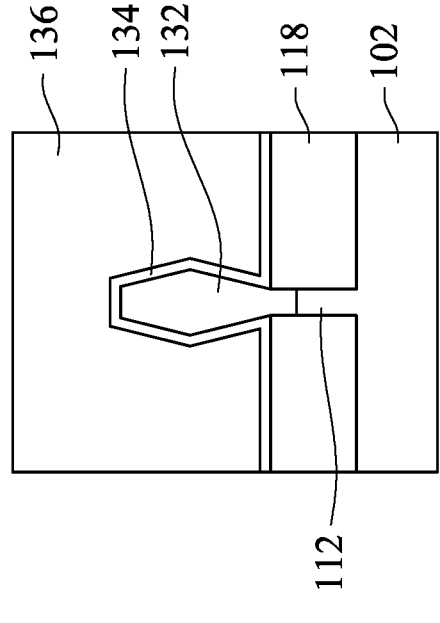
Figure 9D:
Figure 9C:
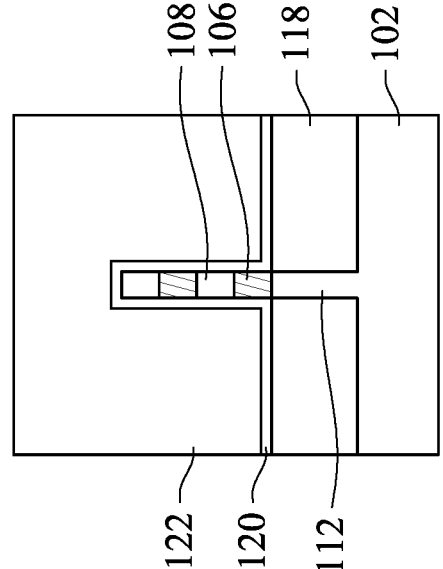
Figure 9C:
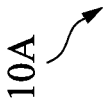
Figure 10B:
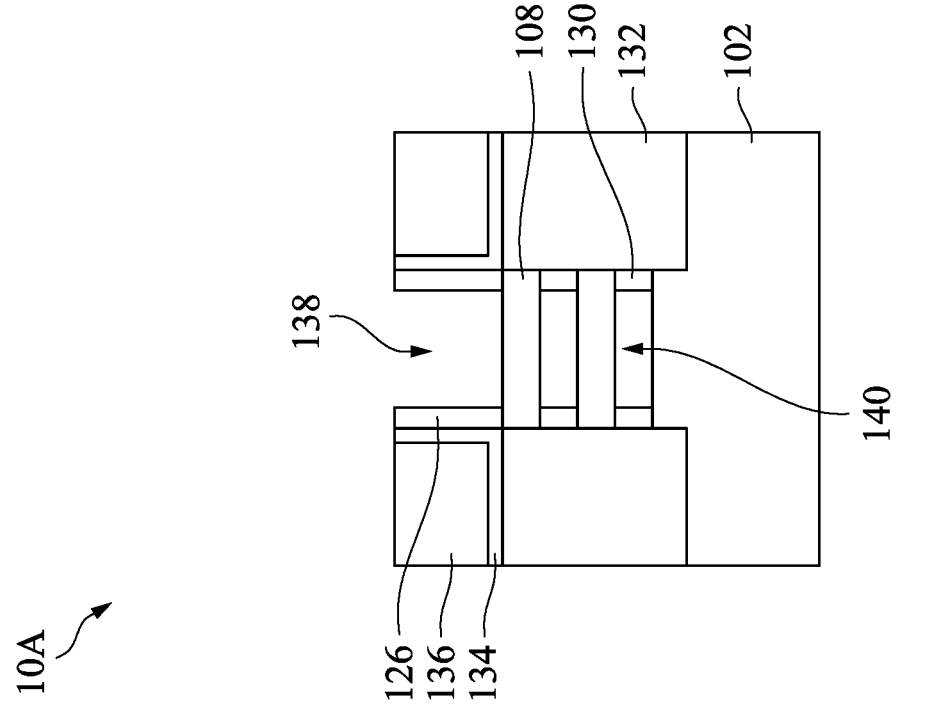
Figure 10A:
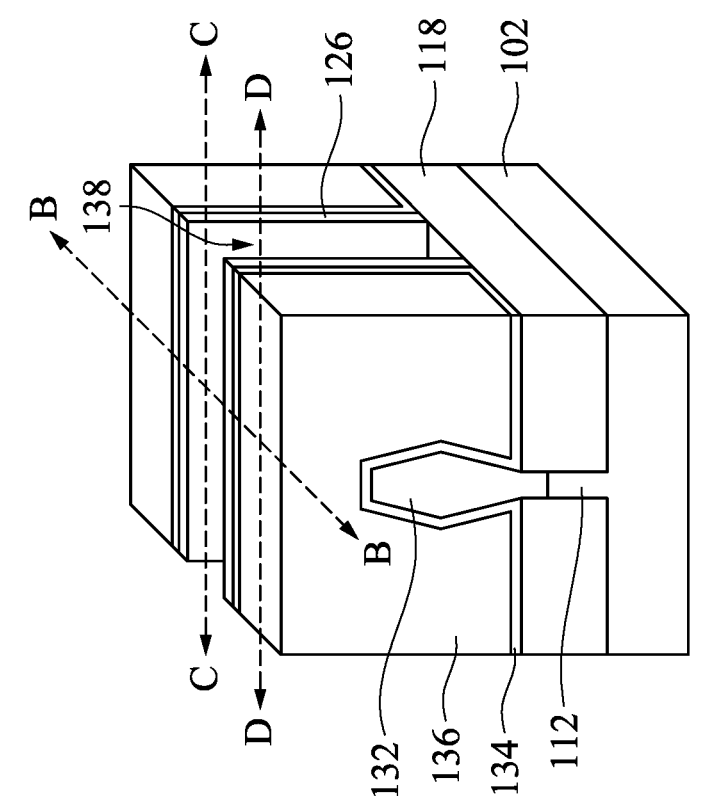
Figure 10D:
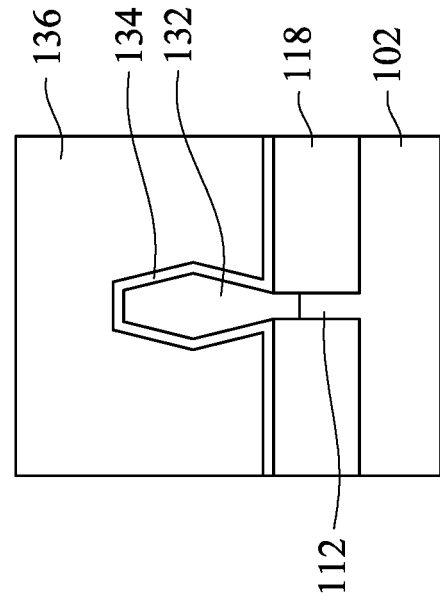
Figure 10C:
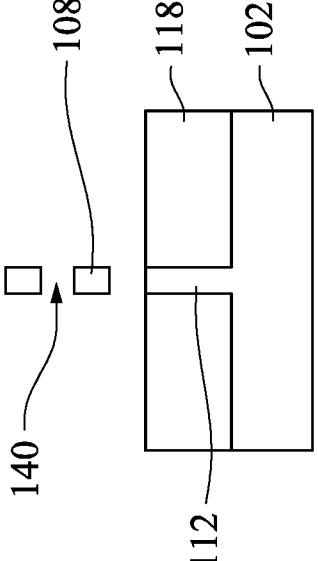
Figures 11A, 11B:
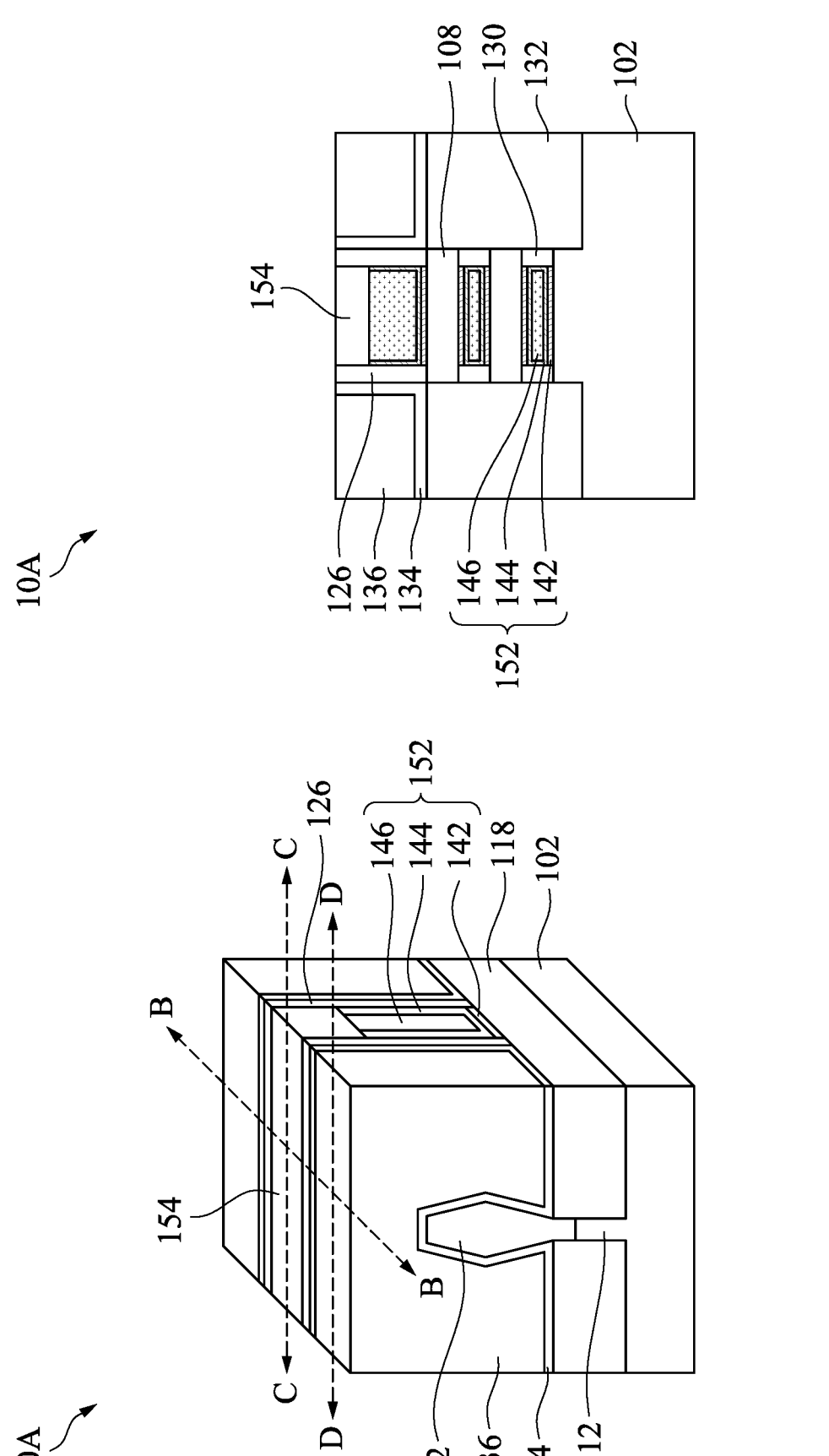
Figure 11D:
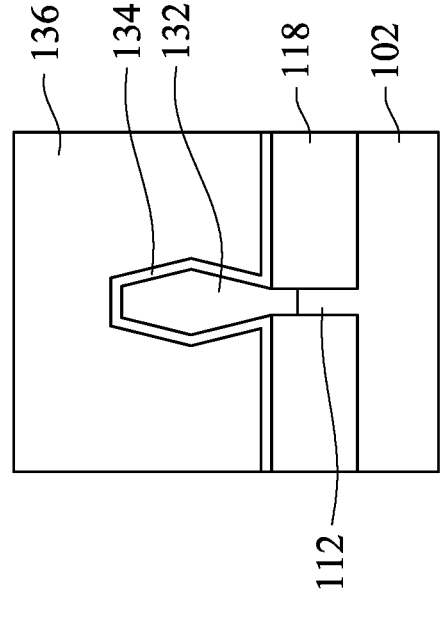
Figure 11C:
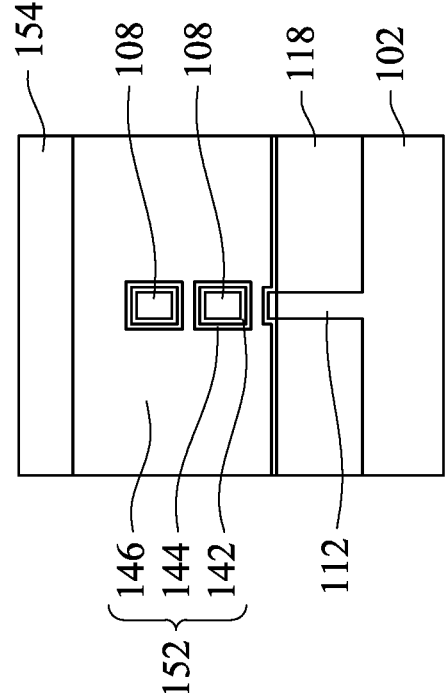
Figures 12A, 12B:
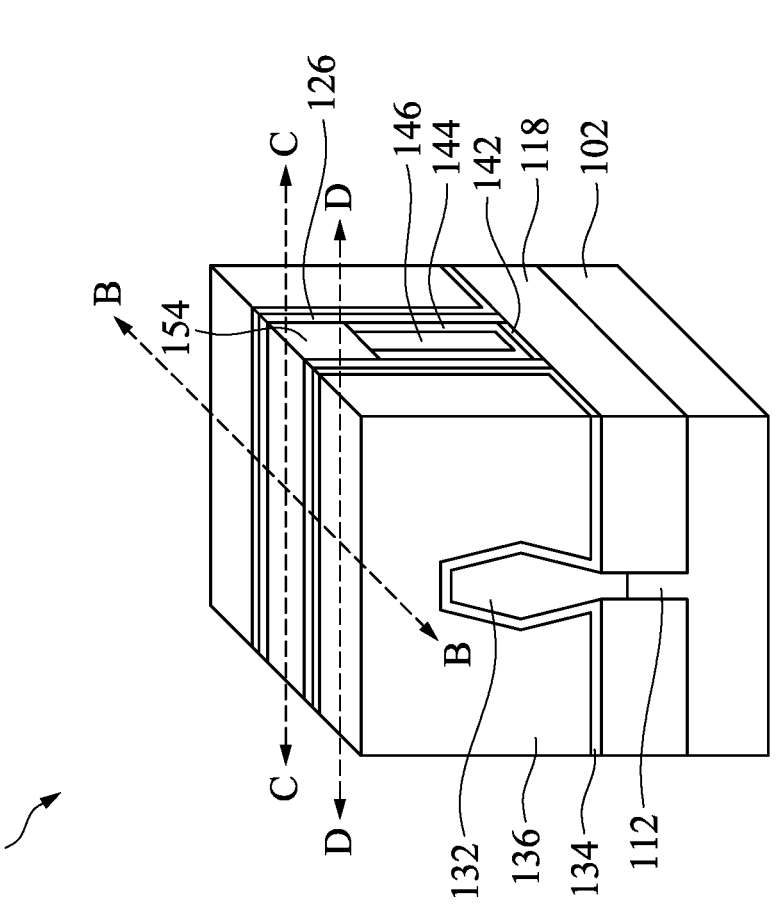
Figure 12D:
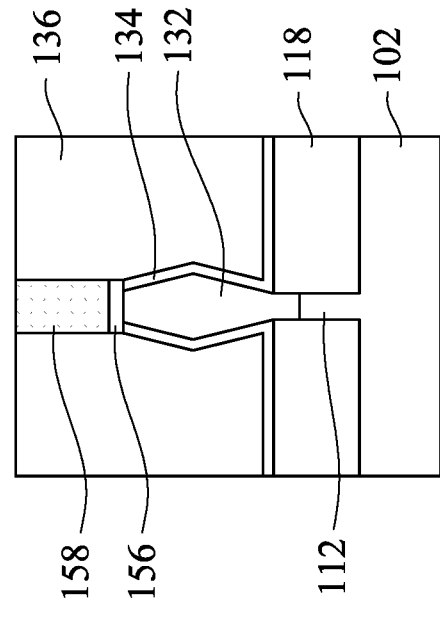
Figure 12D:
Figure 12C:
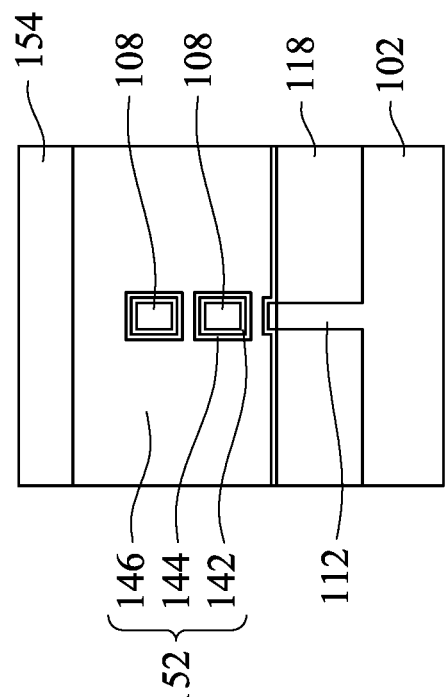
Figure 12C:

Next, in FIGS. 3A-3C, Shallow Trench Isolation (STI) regions 118 are formed over the substrate 102 and on opposing sides of the fin structure 110. As an example to form the STI regions 118, an insulation material may be formed over the substrate 102. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 110. In some embodiments, a liner is first formed along surfaces of the substrate 102 and fin structure 110, and a fill material, such as those discussed above is formed over the liner. In some embodiments, the liner is omitted.

Next, a removal process is applied to the insulation material to remove excess insulation material over the fin structure 110. In some embodiments, a planarization process such as a chemical mechanical polish (CMP), an etch back process, combinations thereof, or the like may be utilized. The planarization process exposes the nanostructure 114 such that a top surface of the nanostructure 114 and the insulation material are level after the planarization process is complete. Next, the insulation material is recessed to form the STI regions 118. The insulation material is recessed such that the nanostructure 114 protrudes from between neighboring STI regions 118. Top portions of the semiconductor fin 112 may also protrude from between neighboring STI regions 118. Further, the top surfaces of the STI regions 118 may have a flat surface as illustrated, a convex surface, a concave surface (such as dishing), or a combination thereof. The top surfaces of the STI regions 118 may be formed flat, convex, and/or concave by an appropriate etch. The STI regions 118 may be recessed using an acceptable etching process, such as one that is selective to the material of the insulation material (e.g., etches the material of the insulation material at a faster rate than the material of the semiconductor fin 112 and the nanostructure 114). For example, a chemical oxide removal with a suitable etchant such as dilute hydrofluoric (dHF) acid may be used.

Reference is made to FIGS. 4A-4D. A dummy gate dielectric 120 is formed over the nanostructure 114 and over the STI regions 118. The dummy gate dielectric 120 may be, for example, silicon oxide, silicon nitride, a combination thereof, or the like, and may be deposited or thermally grown according to acceptable techniques. In an embodiment, a layer of silicon is conformally formed over the nanostructure 114 and over the upper surface of the STI regions 118, and a thermal oxidization process is performed to convert the deposited silicon layer into an oxide layer as the dummy gate dielectric 120.

Next, a dummy gate 122 is formed over the nanostructure 114. To form the dummy gate 122, a dummy gate layer may be formed over the dummy gate dielectric 120. The dummy gate layer may be deposited over the dummy gate dielectric 120 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the STI regions 118.

A Mask 124 is then formed over the dummy gate layer. The masks 124 may be formed from silicon nitride, silicon oxynitride, combinations thereof, or the like, and may be patterned using acceptable photolithography and etching techniques. In the illustrated embodiment, the mask 124 includes a first mask layer 124A (e.g., a silicon oxide layer) and a second mask layer 124B (e.g., a silicon nitride layer). The pattern of the mask 124 is then transferred to the dummy gate layer by an acceptable etching technique to form the dummy gate 122, and then transferred to the dummy dielectric layer by acceptable etching technique to form a dummy gate dielectric 120. The dummy gate 122 covers a channel region of the nanostructure 114. The dummy gate 122 may also have a lengthwise direction substantially perpendicular to the lengthwise direction of the fin structure 110. The dummy gate 122 and the dummy gate dielectric 120 are collectively referred to as dummy gate structure, in some embodiments. Although one fin and one dummy gate structure are illustrated in the figures as a non-limiting example, it should be appreciated that other numbers of fins and other numbers of dummy gate structures may also be formed.

Next, a gate spacer layer is formed by conformally depositing an insulating material over the nanostructure 114, the STI regions 118, the dummy gate 122 and the mask 124. The insulating material may be silicon nitride, silicon carbonitride, a combination thereof, or the like. In some embodiments, the gate spacer layer includes multiple sublayers. The gate spacer layer is then etched by an anisotropic etching process to form gate spacers 126. The resulting structure is shown in FIGS. 5A-5D. The anisotropic etching process may remove horizontal portions of the gate spacer layer (e.g., portions over the STI regions 118 and the dummy gate 122), with remaining vertical portions of the gate spacer layer (e.g., along side walls of the dummy gate 122 and the dummy gate dielectric 120) forming the gate spacers 126.

After the formation of the gate spacers 126, implantation for lightly doped source/drain (LDD) regions (not shown) may be performed. Appropriate type (e.g., p-type or n-type) impurities may be implanted into the exposed nanostructure 114 and/or the semiconductor fin 112. The n-type impurities may be the any suitable n-type impurities, such as phosphorus, arsenic, antimony, or the like, and the p-type impurities may be the any suitable p-type impurities, such as boron, $BF_2$, indium, or the like. An anneal process may be used to activate the implanted impurities.

Next, in FIGS. 6A-6D, source/drain recesses 128 are formed in the nanostructure 114 and the semiconductor fin 112. The source/drain recesses 128 may extend through the nanostructure 114 and into the semiconductor fin 112. The source/drain recesses 128 may be formed by any acceptable etching technique, using, e.g., the dummy gate 122 as an etching mask. The source/drain recesses 128 exposes end portions of the first sacrificial layers 106 and end portions of the first semiconductor layers 108.

Sidewalls of the layers of the first sacrificial layers 106 exposed by the source/drain recesses 128 are etched to form sidewall recesses between corresponding first semiconductor layers 108. Although sidewalls of the first semiconductor layers 108 are illustrated as being straight in FIG. 7B, the sidewalls may be concave or convex. The sidewalls may be etched using isotropic etching processes, such as wet etching or the like. In some embodiments in which the first sacrificial layers 106 include, e.g., SiGe, and the first semiconductor layers 108 include, e.g., Si or SiC, a dry etch process with tetramethylammonium hydroxide (TMAH), ammonium hydroxide ($NH_4OH$), or the like may be used to etch sidewalls of the first sacrificial layers 106.

Inner spacers 130 are then formed in the sidewall recesses. The resulting structure is shown in FIGS. 7A-7D. The inner spacers 130 may be formed by depositing an inner spacer layer (not separately illustrated) over the substrate 102, the sidewall recesses, the first semiconductor layers 108, the gate spacers 126 and the mask 124, followed by etching the inner spacer layer may be etched by an anisotropic etching process, such as RIE, NBE, or the like. The inner spacers 130 act as isolation features between subsequently formed epitaxial source/drain regions and gate structure. As will be discussed in greater detail below, epitaxial source/drain regions will be formed in the source/drain recesses 128, and the first sacrificial layers 106 will be replaced with corresponding gate structures.

The inner spacer layer may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. Although outer sidewalls of the inner spacers 130 are illustrated as being flush with sidewalls of the first semiconductor layers 108, the outer sidewalls of the inner spacers 130 may extend beyond or be recessed from sidewalls of the first semiconductor layers 108. Although the outer sidewalls of the inner spacers 130 are illustrated as being straight in FIG. 7B, the outer sidewalls of the inner spacers 130 may be concave or convex. The inner spacer layer may be etched by an anisotropic etching process, such as RIE, NBE, or the like.

Next, in FIGS. 8A-8D, epitaxial source/drain regions 132 are formed in the source/drain recesses 128. In some embodiments, the epitaxial source/drain regions 132 are formed of an epitaxial material(s). In some embodiments, the epitaxial source/drain regions 132 are formed in the source/drain recesses 128 to exert stress in the respective channel regions of the first semiconductor device 10A formed, thereby improving carrier mobility. The epitaxial source/drain regions 132 are formed such that the dummy gate 122 is disposed between neighboring pairs of the epitaxial source/drain regions 132. In some embodiments, the gate spacers 126 are used to separate the epitaxial source/drain regions 132 from the dummy gate 122 by an appropriate lateral distance so that the epitaxial source/drain regions 132 do not short out subsequently formed gate of the resulting first semiconductor device 10A.

The epitaxial source/drain regions 132 are epitaxially grown in the source/drain recesses 128, in some embodiments. The epitaxial source/drain regions 132 may include any acceptable material, such as appropriate for n-type or p-type device. For example, when n-type devices are formed, the epitaxial source/drain regions 132 may include materials exerting a tensile strain in the channel regions, such as silicon, SiC, SiCP, SiP, or the like. Likewise, when p-type devices are formed, the epitaxial source/drain regions 132 may include materials exerting a compressive strain in the channel regions, such as SiGe, SiGeB, Ge, GeSn, or the like. The epitaxial source/drain regions 132 may have surfaces raised from respective surfaces of the semiconductor fin 112 and may have facets.

The epitaxial source/drain regions 132 and/or the semiconductor fin 112 may be implanted with dopants to form source/drain regions, similar to the process previously discussed for forming lightly-doped source/drain regions, followed by an anneal. The n-type and/or p-type impurities for epitaxial source/drain regions 132 may be any of the impurities previously discussed. In some embodiments, the epitaxial source/drain regions 132 may be in situ doped during growth. As a result of the epitaxy processes used to form the epitaxial source/drain regions 132, upper surfaces of the epitaxial source/drain regions 132 have facets which expand laterally outward beyond sidewalls of the semiconductor fin 112.

Next, in FIGS. 9A-9D, a contact etch stop layer (CESL) 134 is formed (e.g., conformally) over the epitaxial source/drain regions 132 and over the dummy gate 122, and a first inter-layer dielectric (ILD) 136 is then deposited over the CESL 134. The CESL 134 is formed of a material having a different etch rate than the first ILD layer 136, and may be formed of silicon nitride using PECVD, although other dielectric materials such as silicon oxide, silicon oxynitride, combinations thereof, or the like, and alternative techniques of forming the CESL 134, such as low pressure CVD (LPCVD), PVD, or the like, could be used.

The first ILD layer 136 may be formed of a dielectric material, and may be deposited by any suitable method, such as CVD, plasma-enhanced CVD (PECVD), or FCVD. Dielectric materials for the first ILD layer 136 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Next, the dummy gate 122 is removed. To remove the dummy gate 122, a planarization process, such as a CMP, may be performed to level the top surfaces of the first ILD layer 136 and the CESL 134 with the top surfaces of the dummy gate 122 and gate spacers 126. The planarization process may also remove the mask 124 (see FIG. 9B) on the dummy gate 122 (if the mask 124 has not been removed by the anisotropic etching process to form the gate spacers 126), and portions of the gate spacers 126 along sidewalls of the mask 124. After the planarization process, top surfaces of the dummy gate 122, the gate spacers 126, and the first ILD layer 136 are level. Accordingly, the top surface of the dummy gate 122 is exposed at the upper surface of the first ILD layer 136.

After the planarization process, the dummy gate 122 is removed in an etching step(s), so that a gate trench 138 (may also be referred to as an opening) is formed between the gate spacers 126. In some embodiments, the dummy gate 122 is removed by an anisotropic dry etch process. For example, the etching process may include a dry etch process using reaction gas(es) that selectively etch the dummy gate 122 without etching the first ILD layer 136 or the gate spacers 126. The gate trenches 138 exposes the channel regions of the first semiconductor device 10A. The channel regions are disposed between neighboring pairs of the epitaxial source/drain regions 132. During the removal of the dummy gate 122, the dummy gate dielectric 120 may be used as an etch stop layer when the dummy gate 122 is etched. The dummy gate dielectric 120 may then be removed after the removal of the dummy gate 122. After removal of the dummy gate 122, the first sacrificial layers 106 and the first semiconductor layer 108 that were disposed under the dummy gate 122 are exposed by the gate trench 138.

Next, the first sacrificial layers 106 are removed to release the first semiconductor layer 108, as shown in FIGS. 10A-10D. After the first sacrificial layers 106 are removed, the first semiconductor layer 108 form a plurality of nanosheets that extend horizontally (e.g., parallel to a major upper surface of the substrate 102). The first semiconductor layer 108 may be collectively referred to as the channel regions or the channel layers of the first semiconductor device 10A formed. Gaps 140 (e.g., empty spaces) are formed between the first semiconductor layer 108 by the removal of the first sacrificial layers 106. The first sacrificial layers 106 may also be referred to as nanowires, and the first semiconductor device 10A may also be referred to as a gate-all-around (GAA) device, in some embodiments.

In some embodiments, the first sacrificial layers 106 are removed by a selective etching process using an etchant that is selective to (e.g., having a higher etch rate for) the first sacrificial layers 106, such that the first sacrificial layers 106 are removed without substantially attacking the first semiconductor layer 108. In an embodiment, an isotropic etching process is performed to remove the first sacrificial layers 106.

Next, in FIGS. 11A-11D, an interfacial layer 142 is formed (e.g., conformally) in the gate trench 138 and in the gaps 140. The interfacial layer 142 wraps around the first semiconductor layer 108 and extends along the upper surface of the semiconductor fin 112. For example, the interfacial layer 142 is in contact with the semiconductor fin 112. The interfacial layer 142 may be a silicon oxide-containing layer. For example, the interfacial layer 142 may include a dielectric material such as silicon oxide ($SiO_2$) or silicon oxynitride (SiON). The interfacial layer 142 may be formed by chemical oxidation, thermal oxidation, atomic layer deposition (ALD), chemical vapor deposition (CVD), and/or other suitable method.

A gate dielectric layer 144 is formed (e.g., conformally) in the gate trench 138 and in the gaps 140. The gate dielectric layer 144 wraps around the first semiconductor layer 108, lines sidewalls of the gate spacers 126, and extends along the upper surface and sidewalls of the semiconductor fin 112. In some embodiments, the gate dielectric layer 144 includes silicon oxide, silicon nitride, or multilayers thereof. In some embodiments, the gate dielectric layer 144 includes a high-k dielectric material, and in these embodiments, the gate dielectric layer 144 may have a dielectric constant greater than about 7.0, and may include a metal oxide or a silicate of Hf, Al, Zr, La, Mg, Ba, Ti, or Pb, or combinations thereof. The formation methods of the gate dielectric layer 144 may include Molecular-Beam Deposition (MBD), ALD, PECVD, and the like.

Next, a gate electrode material (e.g., an electrically conductive material) is formed in the gate trench 138 and in the gaps 140 to form a gate electrode 146. The gate electrode 146 fills the remaining portions of the gate trench 138 and in the gaps 140. For example, the gate electrode 146 includes one or more work function layers and a fill metal layer (not separately illustrated). A CMP is then performed on the gate electrode 146 and the gate dielectric layer 144 until the first ILD layer 136 is exposed, resulting in the fill metal layer 150, the one or more work function layers 148 and the gate dielectric layer 144, the CESL 134, and the first ILD layer 136 having substantially level top surfaces. The gate electrode 146, the gate dielectric layer 144 and the interfacial layer 142 are collectively referred to as a first metal gate structure 152.

The one or more work function layers may be deposited to surround each of the first semiconductor layers 108. A portion of the one or more work function layers is formed vertically between adjacent first semiconductor layers 108 and fills the gaps 140 between adjacent first semiconductor layers 108.

The one or more work function layers can provide a suitable work function for the high-k/metal gate structures. For an n-type device, the one or more work function layers may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TIC), aluminum carbide (AlC)), aluminides, and/or other suitable materials. On the other hand, for a p-type device, the one or more work function layers may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal layer may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The gate electrode 146 and the gate dielectric layer 144 are recessed in an etching step(s), so that a recess is formed. The recess allows for subsequently formed self-aligned contact (SAC) to be formed within the recess to protect the first metal gate structure 152. The gate electrode 146 and the gate dielectric layer 144 may be recessed using an acceptable etching process, such as one that is selective to the materials of the gate electrode 146 and the gate dielectric layer 144.

A self-aligned contact (SAC) 154 is formed over the first ILD layer 136 and within the recess over gate electrode 146 and the gate dielectric layer 144. The SAC 154 may be made of SiN, SiON, $SiO_2$, the like, or a combination thereof. The SAC 154 may be formed by CVD, PVD, ALD, a spin-on-dielectric process, the like, or a combination thereof. A planarization process, such as a CMP process, may be performed to level a top surface of the first ILD layer 136 with a top surface of the SAC 154. Accordingly, the top surface of the first ILD layer 136 is exposed. The SAC 154 over the first metal gate structure 152 is used to prevent source/drain contact-to-gate short.

Referring to FIGS. 12A-12D, the first ILD layer 136 is removed, such as in a wet etch step or the like. Recesses are thus formed over the epitaxial source/drain regions 132. The CESL 134 under the first ILD layer 136 is removed, leaving a portion of the CESL 134 extending along opposite side-walls of the gate spacers 126 and exposing the epitaxial source/drain regions 132.

Silicide layers 156 are formed in the recesses over the epitaxial source/drain regions 132 by a silicidation process. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. After the annealing process, the unreacted metal material is removed. In some embodiments, the silicide layers 156 are formed of one or more of cobalt silicide (e.g. CoSi, $CoSi_2$. $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Contact plugs 158 are formed filling the recesses by a deposition process and a subsequent planarization process such as CMP. The contact plugs 158 may be made of a conductive material, such as copper (Cu), aluminum (Al), tungsten (W), titanium (Ti), titanium nitride (TiN), tantalum (Ta), tantalum nitride (TaN), or another applicable material, and may be formed by any suitable deposition method, such as PVD, CVD. ALD, plating (e.g. electroplating).

Figure 13A:
FIG. 13A is a cross-sectional view of manufacturing second semiconductor device and first semiconductor device in accordance with some embodiments.
Figure 13A:
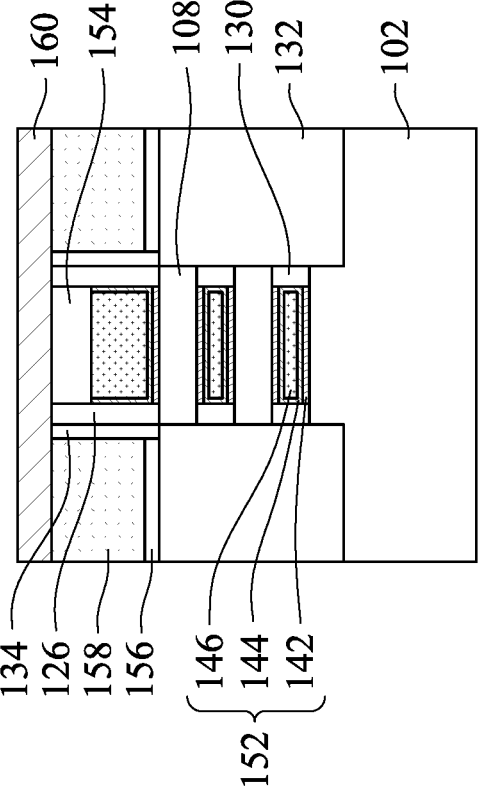
Figure 13A:
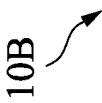
Figure 13A:
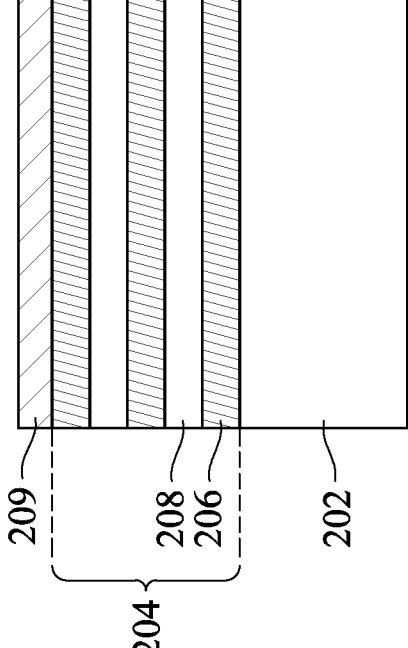
Figure 13B:
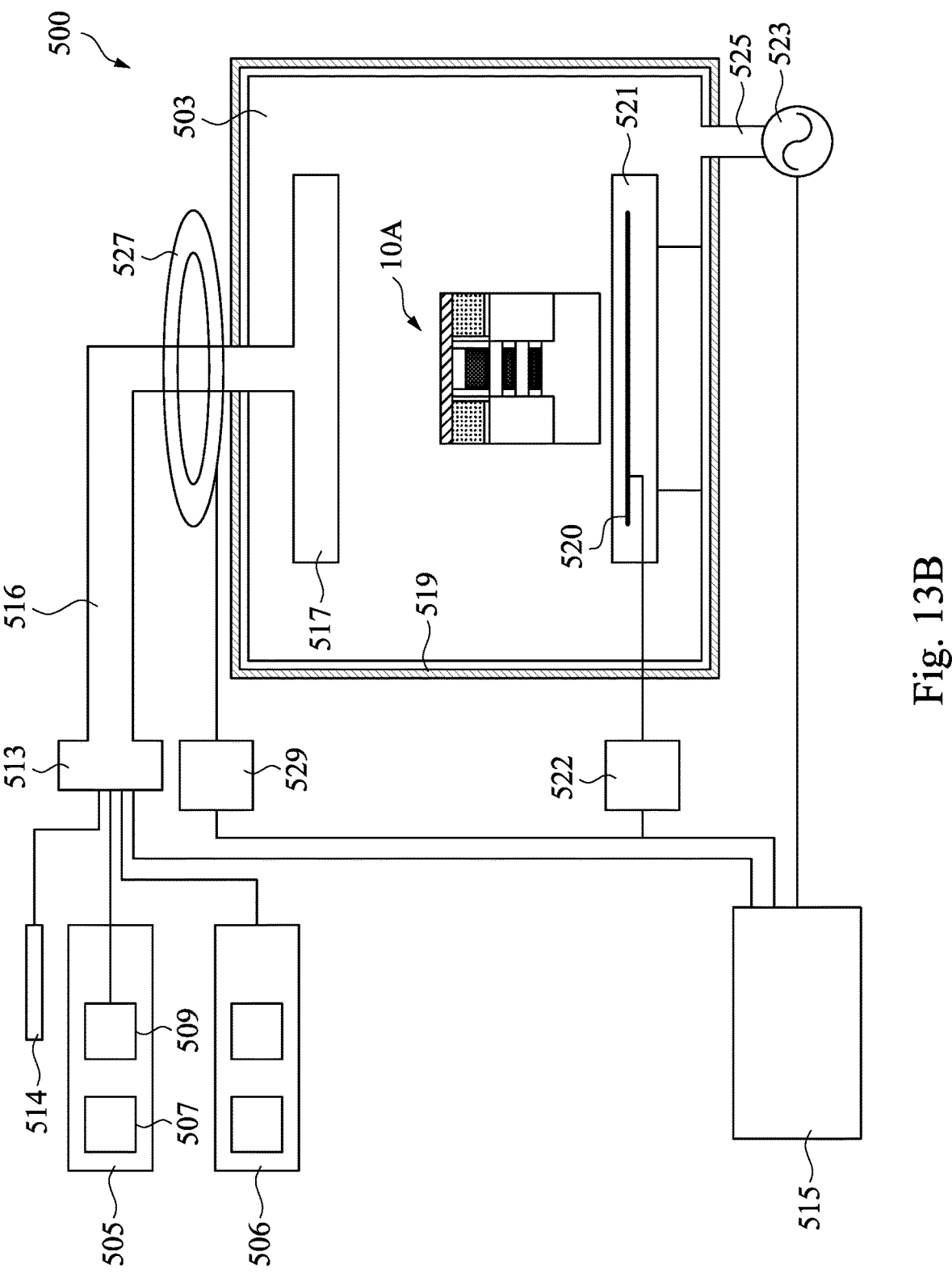
FIG. 13B illustrates a deposition system that may be used to deposit the first dielectric layer using plasma enhanced atomic layer deposition (PEALD).
Figure 13C:
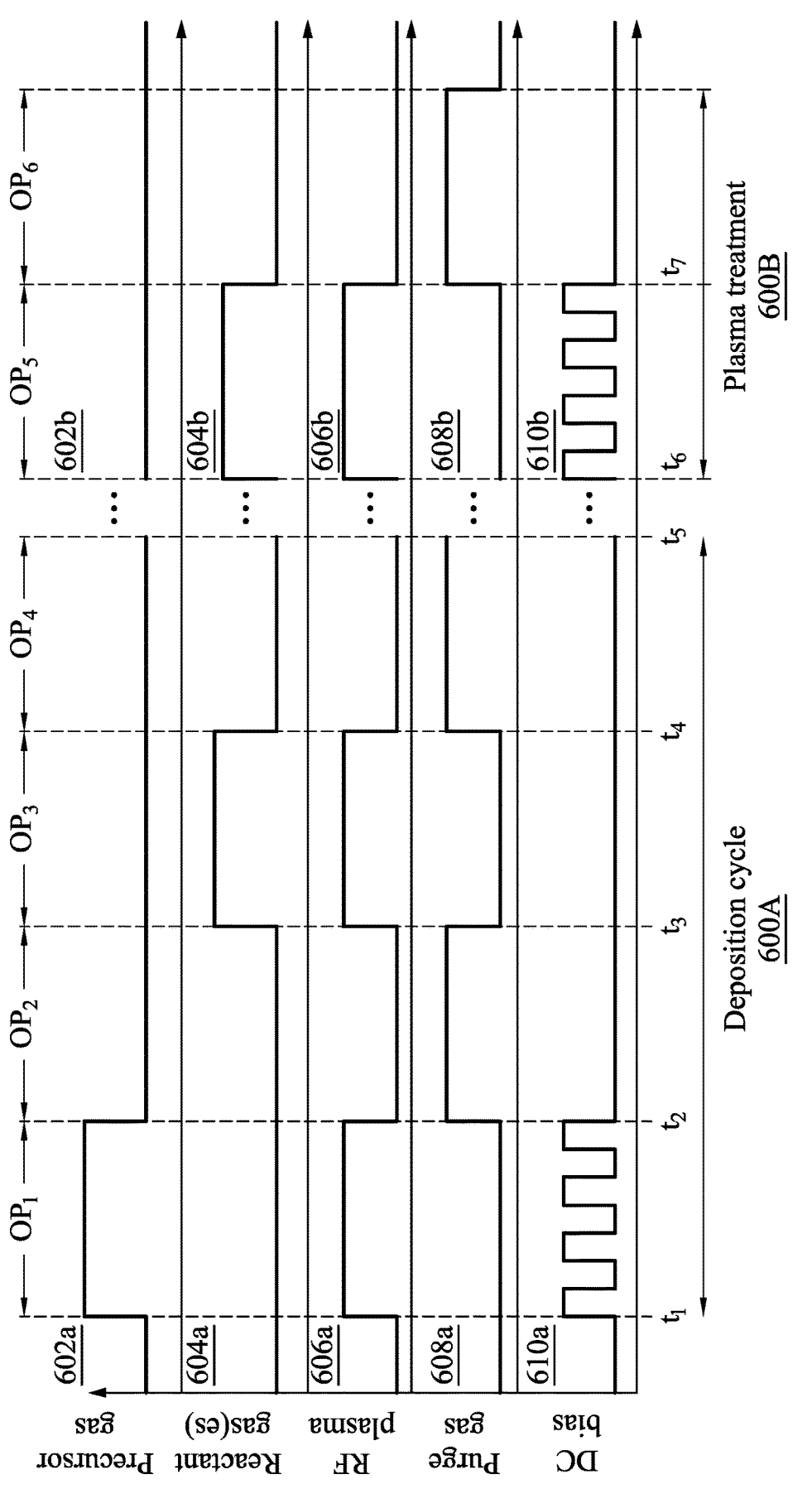
FIG. 13C shows timing diagrams illustrating an exemplary operation of the deposition system by the control unit.
Figure 13D:
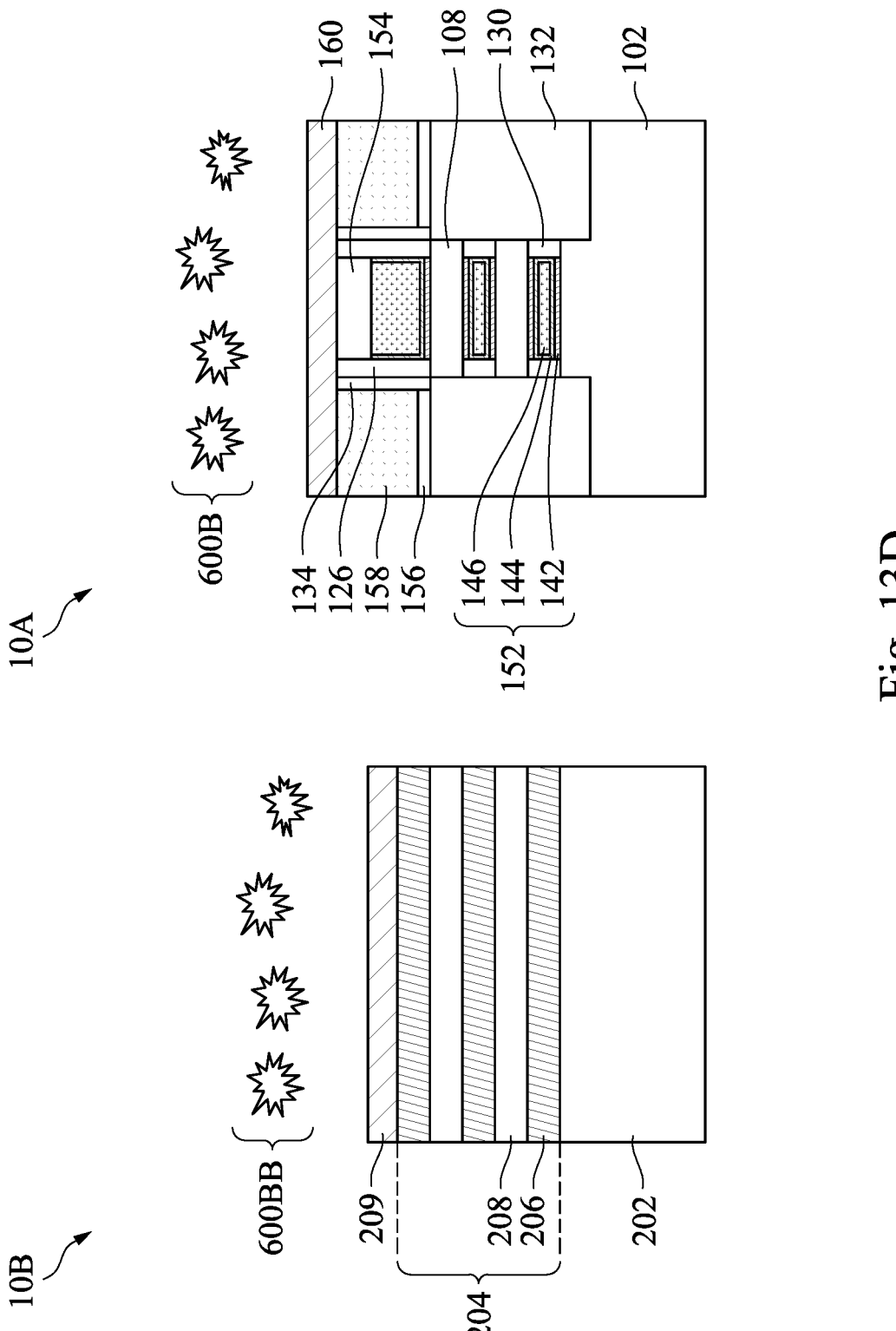
FIG. 13D is cross-sectional view of manufacturing second semiconductor device and first semiconductor device in accordance with some embodiments.

FIGS. 13A and 13D are cross-sectional views of manufacturing the second semiconductor device 10A and the first semiconductor device 10B in accordance with some embodiments. Reference is made to FIG. 13A. A second semiconductor device 10B may be formed. The second semiconductor device 10B may include a substrate 202 and a multi-layer stack 204 formed on the substrate 202. The substrate 202 may include the same material of the substrate 102. The multi-layer stack 204 includes alternating stacked second sacrificial layers 206 and second semiconductor layers 208. Three layers of second sacrificial layers 206 and two layers of second semiconductor layers 208 are shown for illustrative purpose and is not intended to be limiting beyond what is s specifically recited in the claims. It can be appreciated that any number of second sacrificial layers 206 and second semiconductor layers 208 can be formed in the multi-layer stack 204. The second semiconductor layers 208 are similar to the first semiconductor layers 108 in terms of composition and formation, and the second sacrificial layers 206 are similar to the first sacrificial layers 106 in terms of composition and formation as discussed previously with regard to FIGS. 1A-1C.

A first dielectric layer 160 is formed on a top surface of the first semiconductor device 10A. For example, the first dielectric layer 160 is formed on top surfaces of the contact plugs 158, the gate spacers 126, the CESL 134 and the SAC 154. The first dielectric layer 160 may be an oxide layer, such as $SiO_2$ layer, SiON layer, or SiOCN layer. In some embodiments, the first dielectric layer 160 is formed by plasma enhanced atomic layer deposition (PEALD). A second dielectric layer 209 is formed on a top surface of the multilayer stack 204, and is similar to the first dielectric layer 160 in terms of composition and formation. For the simplicity, the formation of the first dielectric layer 160 is illustrated and discussed below, and the discussion of the second dielectric layer 209 is omitted.

FIG. 13B illustrates a deposition system 500 that may be used to deposit the first dielectric layer 160 using plasma enhanced atomic layer deposition (PEALD). In some embodiments, the deposition system 500 may be Capacitively coupled plasma (CCP) processing system, Inductively coupled plasma (ICP), Microwave Induce Plasma (MIP), or Hollow Cathode Plasma (HCP). In an embodiment, the deposition system 500 receives precursor materials from a precursor delivery system 505 and/or reactant materials from a reactant delivery system 506. In an embodiment, the precursor delivery system 505 and the reactant delivery system 506 may work in conjunction with one another to supply the various different precursor materials to a chamber 503 wherein a workpiece, for example, the first semiconductor device 10A, is placed. In other embodiments, fewer or more precursor delivery systems may be used.

For example, the precursor delivery system 505 and the reactant delivery system 506 may each include a gas supply 507 and a flow controller 509. In an embodiment in which the precursor material is stored in a gaseous state, the gas supply 507 may supply the precursor material to the chamber 503. The gas supply 507 may be a vessel, such as a gas storage tank, that is located either locally to the chamber 503 or else may be located remotely from the chamber 503. Alternatively, the gas supply 507 may be a facility that independently prepares and delivers the precursor material to the flow controller 509. Any suitable source for the precursor material may be utilized as the gas supply 507, and all such sources are fully intended to be included within the scope of the embodiments.

The gas supply 507 may supply the desired precursor to the flow controller 509. The flow controller 509 may be used to control the flow of the precursor to the gas controller 513 and, eventually, to the chamber 503, thereby also helping to control the pressure within the chamber 503. The flow controller 509 may be, e.g., a proportional valve, a modulating valve, a needle valve, a pressure regulator, a mass flow controller, combinations of these, or the like. However, any suitable method for controlling and regulating the flow of the precursor materials may be used, and all such components and methods are fully intended to be included within the scope of the embodiments.

However, as one of ordinary skill in the art will recognize, while the precursor delivery system 505 and the reactant delivery system 506 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 500, may alternatively be utilized. All such precursor systems are fully intended to be included within the scope of the embodiments.

The precursor delivery system 505 and the reactant delivery system 506 may supply their individual materials into the gas controller 513. The gas controller 513 connects and isolates the precursor delivery system 505 and the reactant delivery system 506 from the chamber 503 in order to deliver the desired materials to the chamber 503. The gas controller 513 may include such devices as valves, flow meters, sensors, and the like to control the delivery rates of each of the precursors, and may be controlled by instructions received from the control unit 515. In some embodiments a purge gas delivery system 514 may be connected to the gas controller 513 and provide a purge gas to the chamber 503. The purge gas delivery system 514 may include a gaseous tank or other facility that provides a purge gas such as nitrogen ($N_2$), inert gas such as helium (He), argon (Ar), xenon (Xe), or combinations of these, or the like, although other suitable purge gases may alternatively be used.

The gas controller 513, upon receiving instructions from the control unit 515, may open and close valves so as to connect one or more of the precursor delivery system 505 or the reactant delivery system 506 to the chamber 503 and direct a desired material through a manifold 516, used the chamber 503, and to a showerhead 517. The showerhead 517 may be used to disperse the chosen materials into the chamber 503 and may be designed to evenly disperse the materials in order to minimize undesired process conditions that may arise from uneven dispersal. In an embodiment the showerhead 517 may have a circular design with openings dispersed evenly around the showerhead 517 to allow for the dispersal of the desired materials into the chamber 503.

However, as one of ordinary skill in the art will recognize, the introduction of materials to the chamber 503 through a single showerhead 517 or through a single point of introduction as described above is intended to be illustrative only and is not intended to be limiting to the embodiments. Any number of separate and independent showerheads 517 or other openings to introduce precursor materials into the chamber 503 may alternatively be used. All such combinations of showerheads and other points of introduction are fully intended to be included within the scope of the embodiments.

The chamber 503 may receive the desired materials and expose the materials to the first semiconductor device 10A. The chamber 503 may be any desired shape that may be suitable for dispersing the materials and contacting the materials with the first semiconductor device 10A. In the embodiment illustrated in FIG. 13B, the chamber 503 has a cylindrical sidewall and a bottom. However, the chamber 503 is not limited to a cylindrical shape, and any other suitable shape, such as a hollow square tube, an octagonal shape, or the like, may be used. Furthermore, the chamber 503 may be surrounded by a housing 519 made of material that is inert to the various process materials. As such, while the housing 519 may be any suitable material that can withstand the chemistries and pressures involved in the deposition process, in an embodiment the housing 519 may be steel, stainless steel, nickel, aluminum, alloys of these, combinations of these, and like.

Within the chamber 503 the first semiconductor device 10A may be placed on a mounting platform 521 in order to position and control the first semiconductor device 10A during the deposition processes. The mounting platform 521 may include heating mechanisms in order to heat the first semiconductor device 10A during the deposition processes. Furthermore, while a single mounting platform 521 is illustrated in FIG. 13B, any number of mounting platforms 521 may additionally be included within the chamber 503.

Additionally, the chamber 503 and the mounting platform 521 may be part of a cluster tool system (not shown). The cluster tool system may be used in conjunction with an automated handling system in order to position and place the semiconductor device into the chamber 503 prior to the deposition processes, position, hold the first semiconductor device 10A during the deposition process, and remove the first semiconductor device 10A from the chamber 503 after a subsequent surface plasma treatment.

The mounting platform 521 may additionally include a first electrode 520 coupled to a first RF generator 522. The first electrode 520 may be electrically biased by the first RF generator 522 (under control of the control unit 515) at a RF voltage during the deposition process. By being electrically biased, the first electrode 520 is used to provide a bias to the incoming gaseous material (e.g., precursor gases, reactants, purge gases, etc.) and assist to ignite them into a plasma during a step of the deposition process. Additionally, the first electrode 520 is also used to maintain the plasma during the deposition process by maintaining the bias.

The chamber 503 also includes an upper electrode 527, for use as a plasma generator. In some embodiments, the plasma generator may be a transformer coupled plasma generator and may be, e.g., a coil. The coil may be attached to a second RF generator 529 that is used to provide power to the upper electrode 527 (under control of the control unit 515) in order to ignite the plasma during introduction of the gaseous material. However, while the upper electrode 527 is described above as a transformer coupled plasma generator, embodiments are not intended to be limited to a transformer coupled plasma generator. Rather, any suitable method of generating the plasma, such as capacitively coupled plasma (CCP), inductively coupled plasma (ICP), microwave induce plasma (MIP), hollow cathode plasma (HCP), or the like, may alternatively be used. All such methods are fully intended to be included within the scope of the embodiments.

The chamber 503 may also have an exhaust outlet 525 for exhaust gases to exit the chamber 503. A vacuum pump 523 may be connected to the exhaust outlet 525 of the chamber 503 in order to help evacuate the exhaust gases. The vacuum pump 523, under control of the control unit 515, may also be utilized to reduce and control the pressure within the chamber 503 to a desired pressure and may also be used to evacuate precursor materials, reactant materials, or reaction byproducts from the chamber 503 in preparation for another step of the deposition process.

The control unit 515 is configured to control operation of one or more components of the deposition system 500, so as to cause the deposition system 500 to perform a PEALD process that forms a deposited layer on a workpiece (e.g., the semiconductor device). The control unit 515 is configured to sequentially control the flow of the reactant gas, the precursor gas, and the purge gas, as well as the operation of the first and second RF generators 522, 529.

It will be appreciated that the precursor gas and the reactant gas for forming the first dielectric layer 160 may be chosen based upon a material to be deposited. In various embodiments, the deposited first dielectric layer 160 may include silicon oxide. To form deposited layer comprising a silicon oxide, a silicon-based precursor and a reactant gas may be used. For example, the silicon-based precursor may include organoaminosilane, chlorosilane, or the like. Examples of the silicon-based precursor include $SiCl_4$, Tris(dimethylamido)silane (3DMASi), Tetrakis(dimethylamido)silane (TDMASi), Bis(diethylamino)silane (BDEAS), bis(tert-butylamido)silane (BTBAS), bis(dimethylamido)silane (BDMAS), bis(ethylmethylamino)silane (BEMAS), Diaminosilane ($SiH_2(NH_2)_2$), Silane ($SiH_4$), Disilane ($Si_2H_6$), Dimethyldichlorosilane (DMDCS), Monochlorosilane (MCS), Dichlorosilane (DCS), Hexachlorodisilane ($Si_2Cl_6$), Di(isopropylamino)silane (DIPAS), Di(sec-butylamino)silane (DSBAS), Tetrakis(ethylamido)silane (TEASi), TetraethylorthoSilicate (TEOS), Tris (isopropyl)aminosilane (TIPAS), Trimethylsilane (TMS), Triisopropylsilane (TIPS), Tris(dimethylamino)chlorosilane (3DMASiCl), Tris(ethylmethylamido)silane (3EMAS), or Trisilylamine ($N(SiH_3)_3$). The reactant gas may be an oxygen-containing reactant gas including $O_2$, water, $H_2O_2$, nitrogen oxides ($N_2O$, NO, $NO_2$), ozone, or a combination thereof.

FIG. 13C shows timing diagrams 602a, 604a, 606a, 608a, 610a, 602b, 604b, 606b, 608b, 610b illustrating an exemplary operation of the deposition system 500 by the control unit 515. In a particular embodiment, the deposition process for forming the first dielectric layer 160 may be a plasma-enhanced atomic layer deposition (PEALD) process including a number of repeated deposition cycles 600A. For example, a deposition cycle 600A may include exposing the first semiconductor device 10A with a plasma including the silicon-based precursor, purging the silicon-based precursor, exposing the first semiconductor device 10A with a plasma including the reactant gas with or without inert gas and purging the reactant gas.

As shown in the timing diagram 602a, at a first time $t_1$, the control unit 515 operates to introduce the silicon-based precursor into the chamber 503. The control unit 515 causes the silicon-based precursor to flow into the chamber 503 from the first time $t_1$ to a second time $t_2$.

During a first operating period (OP$_1$), present between the first time $t_1$ and the second time $t_2$, the control unit 515 further operates the second RF generator 529 to ionize the silicon-based precursor to generate a plasma comprising a plurality of ionized precursor molecules within the chamber 503 (as shown in timing diagram 606a). During the first operating period (OP$_1$), the control unit 515 further operates the first RF generator 522 to apply a bias voltage, which varies between a first value and a second value, to the first semiconductor device 10A, as shown in timing diagram 610a. The bias voltage causes ionized precursor molecules to be attracted to the first semiconductor device 10A with a downward force.

At a second time $t_2$ (during a second operating period OP$_2$), the control unit 515 turns off the silicon-based precursor and operates the purge gas delivery system 514 to introduce a purge gas that purges the residue of the precursor gas from the chamber 503, as shown in timing diagram 608a.

During a third operating period (OP$_3$), present between a third time $t_3$ and a fourth time $t_4$, the control unit 515 operates to introduce a reactant gas into the chamber 503 by way of the reactant delivery system 506, as shown in timing diagram 604a. The control unit 515 causes the reactant gas to flow into the chamber 503 from the third time $t_3$ to the fourth time $t_4$.

Although in the timing diagram 608a during the third operating period (OP$_3$), the purge gas is illustrated as not flowing into the chamber 503, in some other embodiments, the purge gas may flow into the chamber 503 such that the reactant gas and the purge gas coexist in the chamber 503.

During the third operating period (OP$_3$), the control unit 515 further operates the second RF generator 529 to ignite a plasma (e.g., an RF plasma) from the reactant gas, as shown in timing diagram 606a. The plasma causes the reactant gas to interact with the deposited silicon-based precursor gas molecules that had accumulated on the first semiconductor device 10A.

At a fourth time $t_4$ (during a fourth operating period (OP$_4$), present between the fourth time $t_4$ and the fifth time $t_5$), the control unit 515 turns off the reactant gas and operates the purge gas delivery system 514 to introduce a purge gas that purges the residue of the reactant gas from the chamber 503, as shown in timing diagram 608a.

In some embodiments, the PEALD process for forming the first dielectric layer 160 is performed at a temperature in a range from 260° C. to 400° C. If the temperature is lower than 260° C., nitrogen atoms, carbon atoms, and/or hydrogen atoms come from the silicon-based precursor may remain in the first dielectric layer 160. It makes the first dielectric layer 160 have a relatively weak structure and could result in delamination under stress.

Referring back to FIG. 13A, in formation of the second dielectric layer 209 over the multilayer stack 204 of the second semiconductor device 10B, if the temperature is higher than 400° C., elements in the second sacrificial layers 206, such as Ge atoms, may be oxidized or interdiffuse into the second semiconductor layers 208.

Since the first and second dielectric layers 160, 209 are formed using PEALD but not flowable chemical vapor deposition (FCVD), UV curing or high temperature annealing for bonding FCVD deposited layers is not required. In other words, no extra UV treatment or thermal treatment is required. Therefore, unwanted oxidation of Ge atoms in the second sacrificial layers 206 and unwanted interdiffusion of Ge atoms between the second sacrificial layers 206 and the second semiconductor layers 208 can be prevented.

Figure 13E:
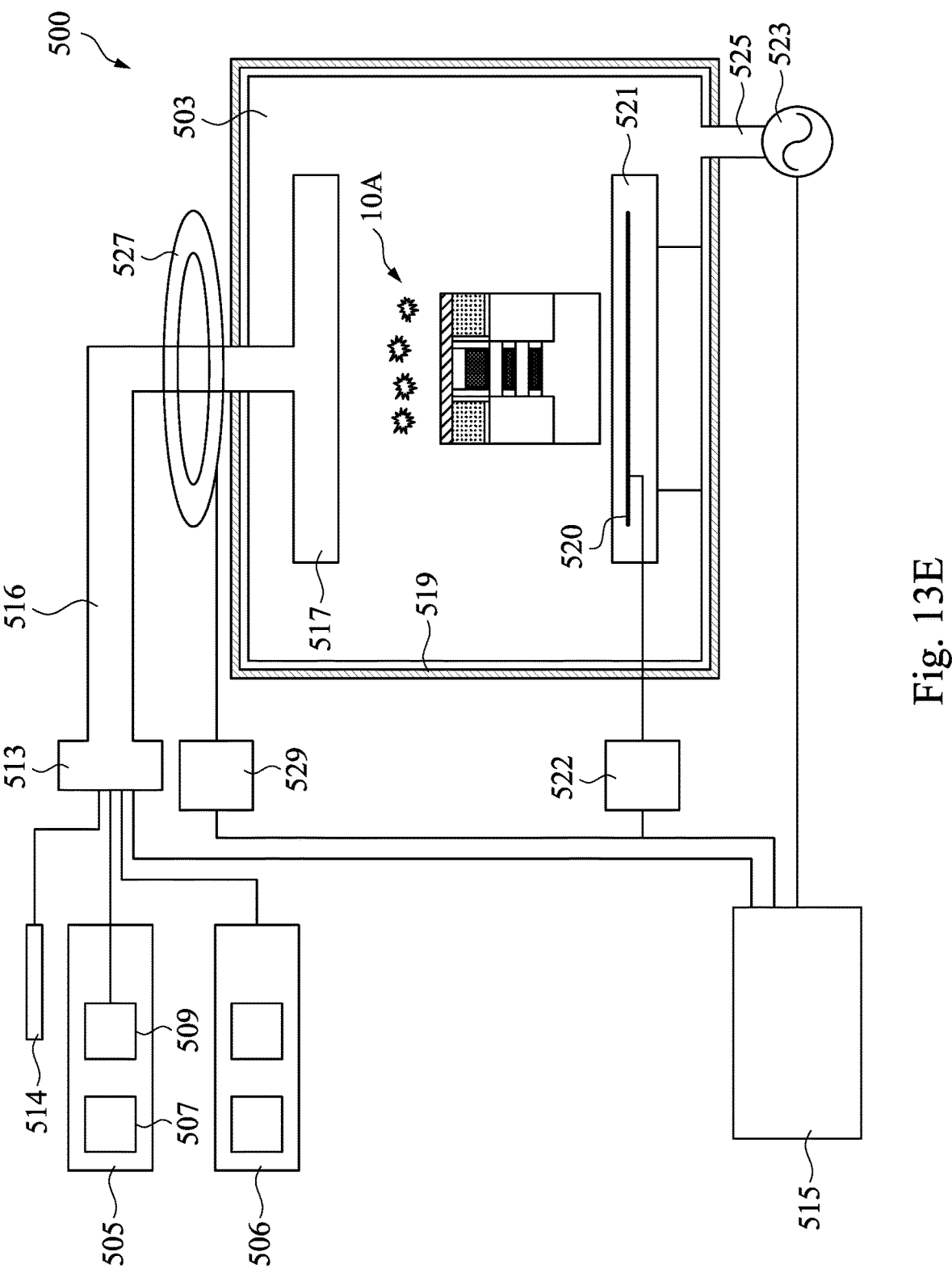
FIG. 13E illustrates a deposition system that may be used to perform plasma treatment to the first dielectric layer.

Reference is made to FIGS. 13C, 13D and 13E. After the formation of the first dielectric layer 160, an in-situ plasma treatment 600B is performed to the first dielectric layer 160. That is, the plasma treatment is performed in the chamber 503 which is same as forming the first dielectric layer 160. Therefore, after forming the first dielectric layer 160, the plasma treatment 600B can then be performed without exposing the first dielectric layer 160 to ambient air. An in-situ plasma treatment 600BB is performed to the second dielectric layer 209, which is similar to the plasma treatment 600B, and the discussion thereof is omitted herein.

The plasma treatment 600B activates the top surface of the first dielectric layer 160 to form silanol or dangling bonds that readily bonds silicon or silicon oxides of the second dielectric layer 209 on the second semiconductor device 10B. In some embodiments, the plasma treatment 600B is performed using $O_2$, $H_2$, $NH_3$, or a combination thereof. In some embodiments, due to the plasma treatment 600B, the first dielectric layer 160 may have a bottom portion and a top portion having different compositions. For example, in an example where the plasma treatment 600B is performed using $O_2$, the top portion has an increased oxygen atomic concentration such that the top portion has an oxygen atomic concentration greater than an oxygen atomic concentration of the bottom portion. This plasma treatment may create an oxygen concentration gradient that changes as a function of thickness in the first dielectric layer 160. Similarly, in one example where the plasma treatment 600B is performed using $NH_3$, the top portion has an increased nitrogen atomic concentration such that the top portion has a nitrogen atomic concentration greater than a nitrogen atomic concentration of the bottom portion. This plasma treatment may create a nitrogen concentration gradient that changes as a function of thickness in the first dielectric layer 160. Similarly, in some embodiments, the plasma treatment 600BB is performed using $O_2$, $H_2$, $NH_3$, or a combination thereof. In some embodiments, due to the plasma treatment 600BB, the second dielectric layer 209 may have a bottom portion and a top portion having different compositions. For example, in an example where the plasma treatment 600BB is performed using $O_2$, the top portion of the second dielectric layer 209 has an increased oxygen atomic concentration such that the top portion has an oxygen atomic concentration greater than an oxygen atomic concentration of the bottom portion of the second dielectric layer 209. This plasma treatment may create an oxygen concentration gradient that changes as a function of thickness in the second dielectric layer 209. Similarly, in one example where the plasma treatment 600BB is performed using $NH_3$, the top portion of the second dielectric layer 209 has an increased nitrogen atomic concentration such that the top portion of the second dielectric layer 209 has a nitrogen atomic concentration greater than a nitrogen atomic concentration of the bottom portion of the second dielectric layer 209. This plasma treatment may create a nitrogen concentration gradient that changes as a function of thickness in the second dielectric layer 209.

As shown in a timing diagram 604b, at a sixth time to, the control unit 515 operates to introduce the reactant gas into the chamber 503. The control unit 515 causes the reactant gas to flow into the chamber 503 from a fifth operating period ($OP_5$), present between the sixth time to and a seventh time $t_7$. The reactant gas may be $O_2$, $H_2$, $NH_3$, or a combination thereof. During the fifth operating period ($OP_5$), the control unit 515 further operates the second RF generator 529 to ionize the reactant gas to generate a plasma comprising a plurality of ionized reactant molecules within the chamber 503 (as shown in timing diagram 606b). During the fifth operating period ($OP_5$), the control unit 515 further operates the first RF generator 522 to apply a bias voltage, which varies between a first value and a second value, to the semiconductor device, as shown in timing diagram 610b. The bias voltage causes ionized reactant molecules to be attracted to the first dielectric layer 160 with a downward force.

Although in the timing diagram 608b during the fifth operating period ($OP_5$), the purge gas is illustrated as not flowing into the chamber 503, in some other embodiments, the purge gas may flow into the chamber 503 such that the reactant gas and the purge gas coexist in the chamber 503.

At a seventh time $t_7$ (during a sixth operating period $OP_6$), the control unit 515 turns off the reactant gas and operates the purge gas delivery system 514 to introduce a purge gas that purges the residue of the reactant gas from the chamber 503, as shown in timing diagram 608b.

Figure 14A:
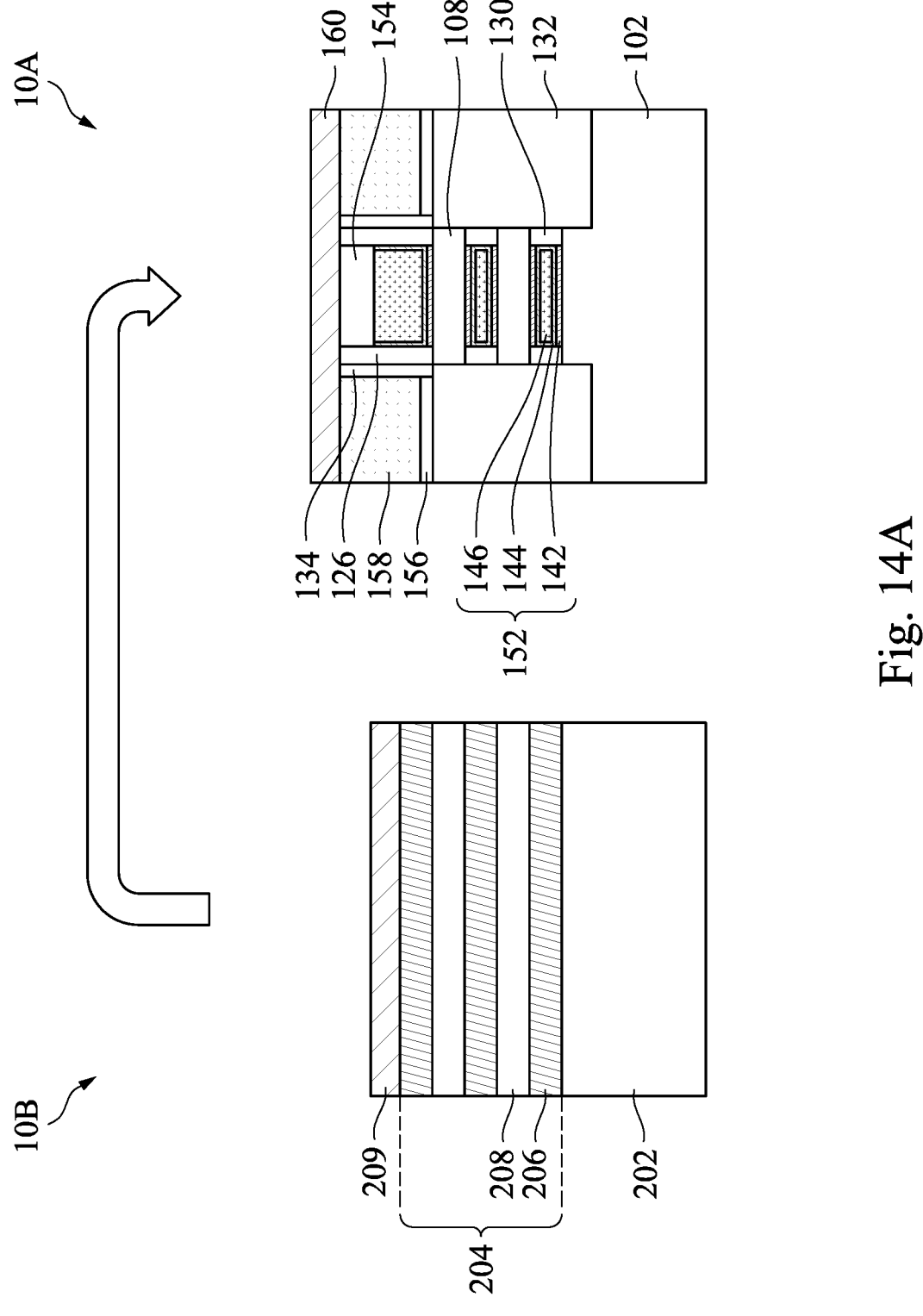
FIGS. 14A-14B are cross-sectional views of manufacturing second semiconductor device over first semiconductor device, which is along B-B line in FIG. 1A, in accordance with some embodiments.
Figure 14B:
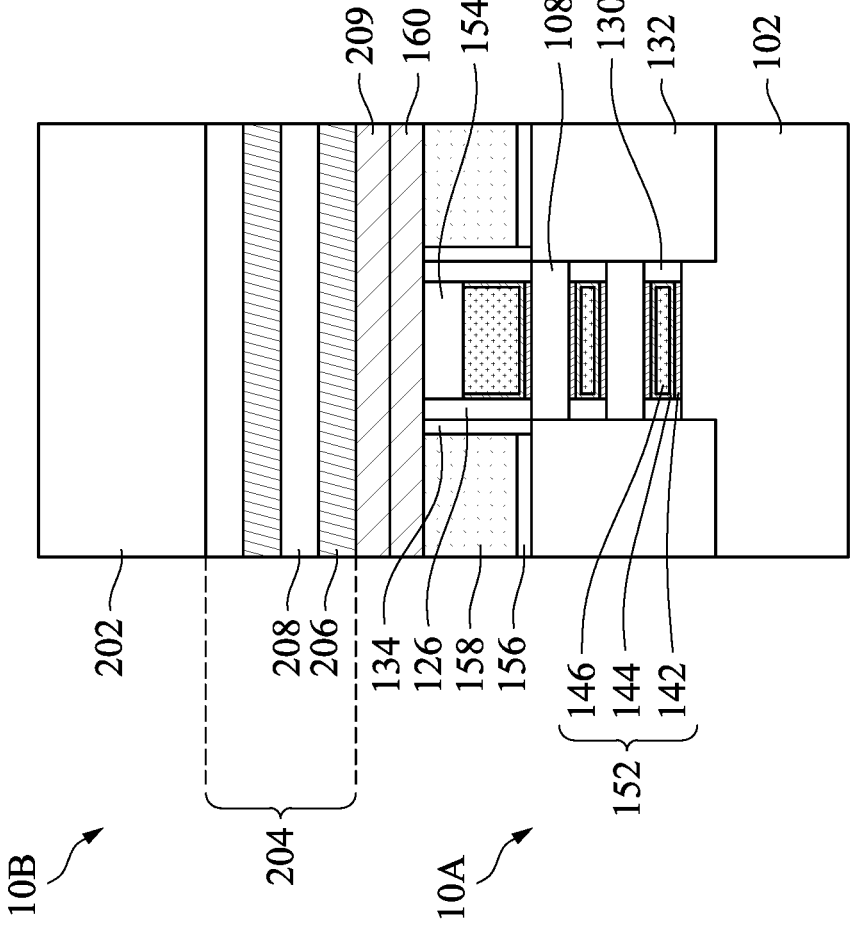
Figure 14C:
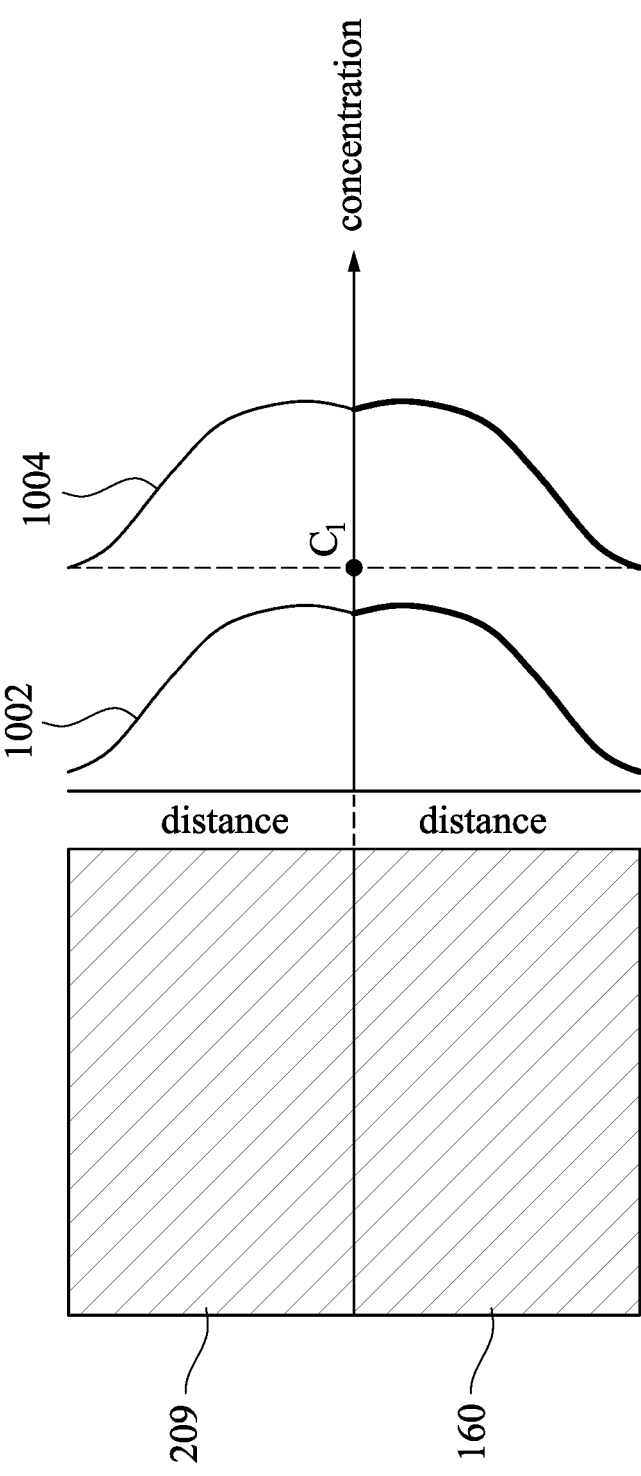
FIG. 14C illustrates an example nitrogen concentration profile and an example oxygen concentration profile within the first and second dielectric layers.

FIGS. 14A-14B are cross-sectional views of manufacturing the second semiconductor device 10B over the first semiconductor device 10A, which is along B-B line in FIG. 1A, in accordance with some embodiments. FIG. 14C illustrates an example nitrogen concentration profile 1002 and an example oxygen concentration profile 1004 within the first and second dielectric layers 160, 209. FIGS. 15, 16A, 17A, 18A, 19A, 20A, 21A, 22A, 23A, 24A and 25A are cross-sectional views of manufacturing the second semiconductor device 10B over the first semiconductor device 10A, which is along B-B line in FIG. 1A, in accordance with some embodiments. FIGS. 16B, 17B, 18B, 19B, 20B, 21B, 22B, 23B, 24B and 25B are cross-sectional views of manufacturing the second semiconductor device 10B over the first semiconductor device 10A, which is along C-C line in FIG. 1A, in accordance with some embodiments. FIGS. 16C, 17C, 18C, 19C, 20C, 21C, 22C, 23C, 24C and 25C are cross-sectional views of manufacturing the second semiconductor device 10B over the first semiconductor device 10A, which is along D-D line in FIG. 1A, in accordance with some embodiments.

Reference is made to FIGS. 14A and 14B. After the plasma treatments 600B, 600BB for the first and second dielectric layers 160, 209, the second semiconductor device 10B may be flipped over. The first dielectric layer 160 and the second dielectric layer 209 are bonded together. In some embodiments, dielectric-to-dielectric bonding is employed to bond the bonding first and second dielectric layers 160 and 209 to form a stacked structure, providing reliable mechanical connections between the bottom GAA-FETs and subsequently formed top GAA-FETs. Dielectric-to-dielectric bonding may be achieved using various techniques, including direct bonding, anodic bonding, or the like. For example, direct bonding, also referred to as fusion bonding or wafer bonding, can be employed to bring two dielectric surfaces of the bonding first and second dielectric layers 160 and 209 into intimate contact with each other, under controlled environmental conditions such as vacuum or an inert atmosphere. This bonding method relies on the surface forces, such as van der Waals forces, to create a strong bond between the first and second dielectric layers 160, 209.

FIG. 14C illustrates an example nitrogen concentration profile 1002 within the first and second dielectric layers 160, 209, and an example oxygen concentration profile 1004 within the first and second dielectric layers 160, 209 in accordance with some embodiments. The nitrogen concentration increases from a top surface of the second dielectric layer 209 to an interface between the first and second dielectric layers 160, 209, and then decreases from the interface therebetween to a bottom surface of the first dielectric layer 160. In other words, the gradient oxygen concentration in the bonded first and second dielectric layers 160, 209 decreases from the interface between the first and second dielectric layers 160, 209 to a top surface of the second dielectric layer 209. Similarly, the oxygen concentration increases from the top surface of the second dielectric layer 209 to the interface between the first and second dielectric layers 160, 209, and then decreases from the interface therebetween to the bottom surface of the first dielectric layer 160. In other words, the bonded first and second dielectric layers 160, 209 have a gradient oxygen concentration increasing from a bottom surface of the first dielectric layer 160 to an interface between the first and second dielectric layers 160, 209. In an example where the first dielectric layer 160 and the second dielectric layer 209 are oxide layers, the oxygen therein both start from a predetermined concentration $C_1$.

In some embodiments, the nitrogen concentration profile 1002 and the oxygen concentration profile 1004 within the first and second dielectric layers 160, 209 can be observed using various analytical techniques such as energy-dispersive X-ray spectroscopy (EDS), electron energy loss spectroscopy (EELS), and secondary ion mass spectrometry (SIMS). These techniques enable the accurate determination of the nitrogen concentration and oxygen concentration and its distribution within the first and second dielectric layers 160, 209.

Figure 15:
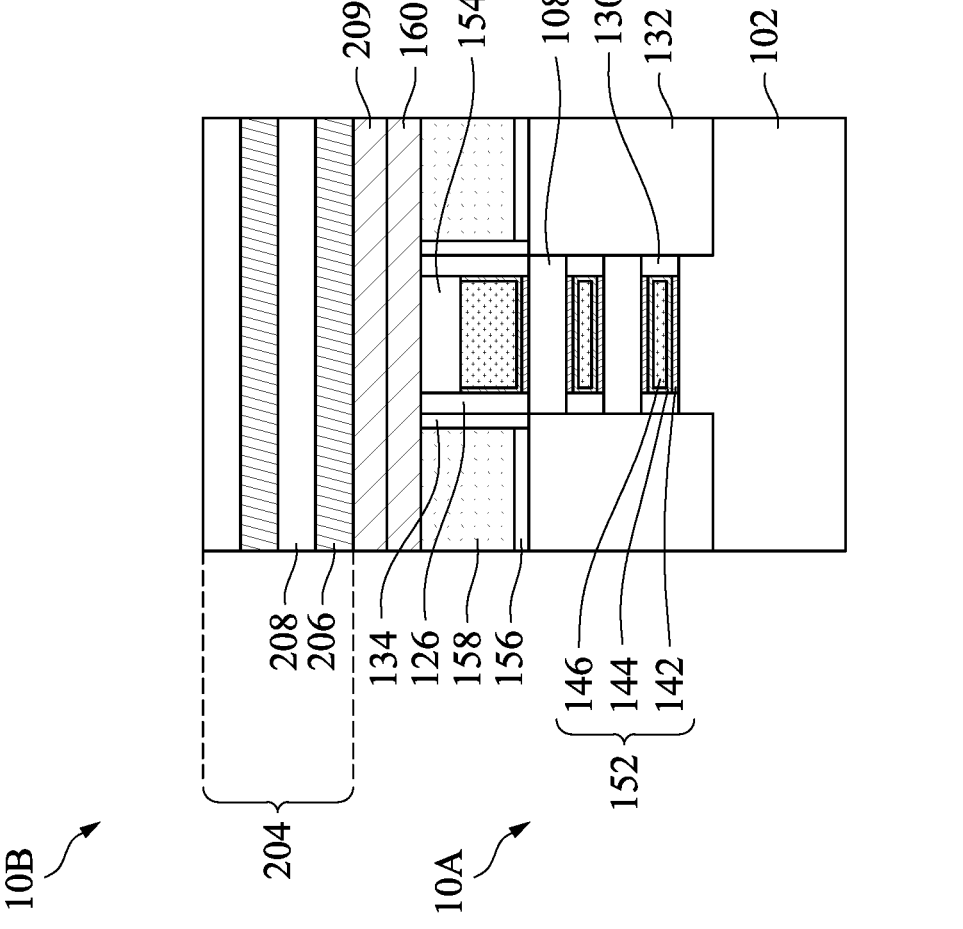
FIGS. 15, 16A, 17A, 18A, 19A, 20A, 21A, 22A, 23A, 24A and 25A are cross-sectional views of manufacturing second semiconductor device over first semiconductor device, which is along B-B line in FIG. 1A, in accordance with some embodiments.

The substrate 202 and a layer of the second sacrificial layers 206 underlying the substrate 202 are removed, exposing a layer of the second semiconductor layers 208, as shown in FIG. 15. Removing of the substrate 202 and the layer of the second sacrificial layer 206 may be performed using thinning process, such as a CMP process, etching or other suitable process.

Figure 16A:
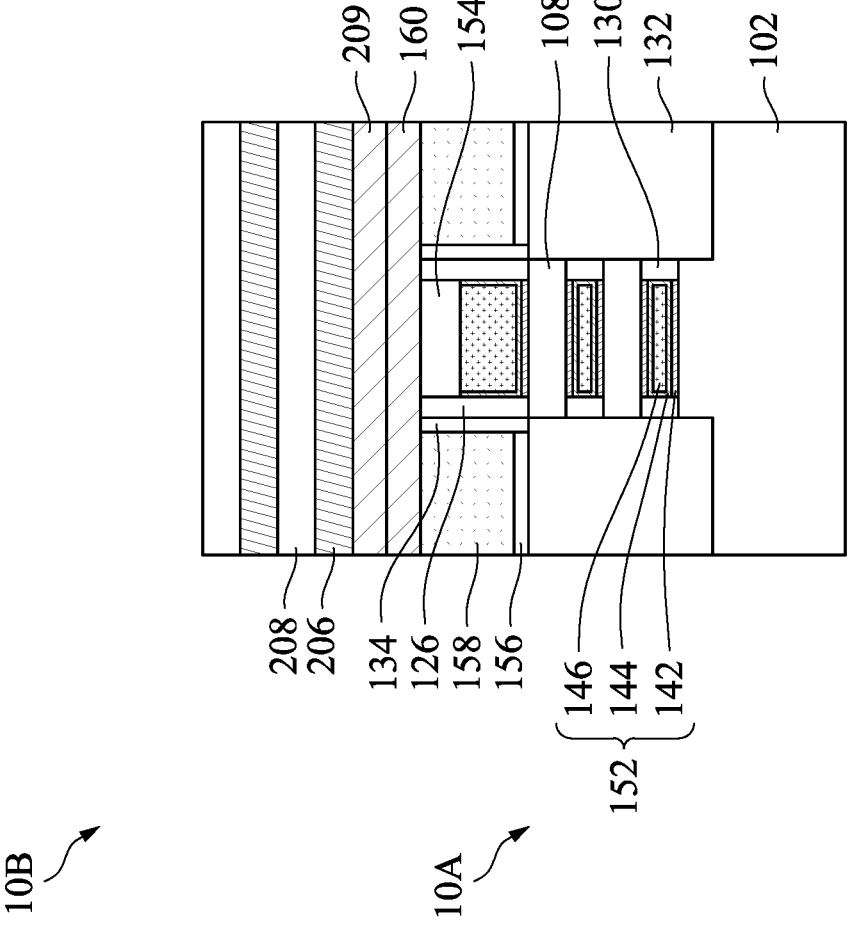
Figure 16C:
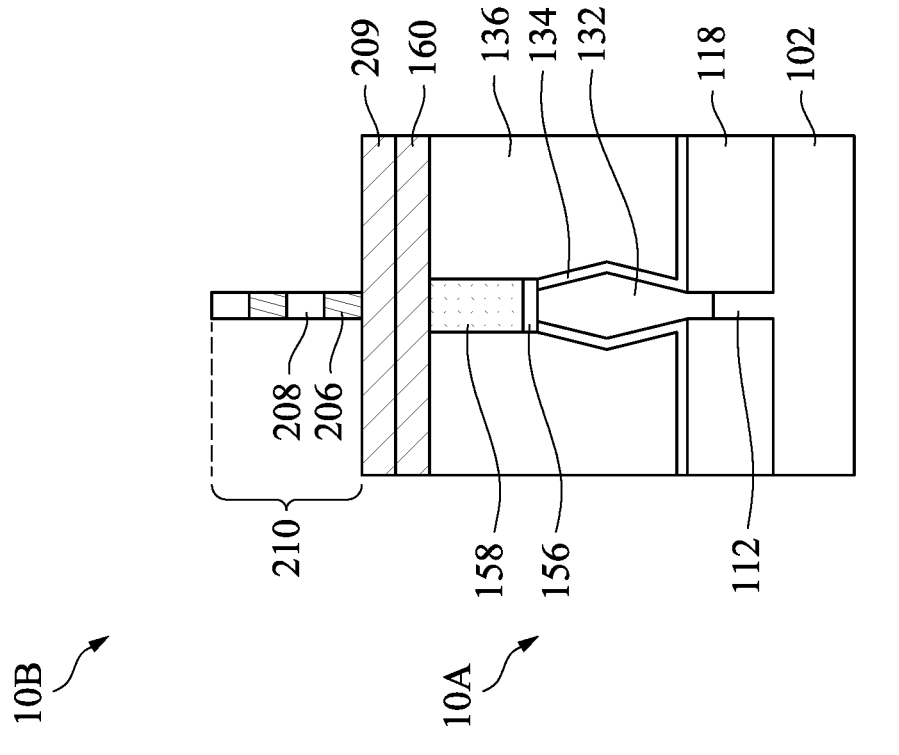
FIGS. 16C, 17C, 18C, 19C, 20C, 21C, 22C, 23C, 24C and 25C are cross-sectional views of manufacturing second semiconductor device over first semiconductor device, which is along D-D line in FIG. 1A, in accordance with some embodiments.
Figure 16B:
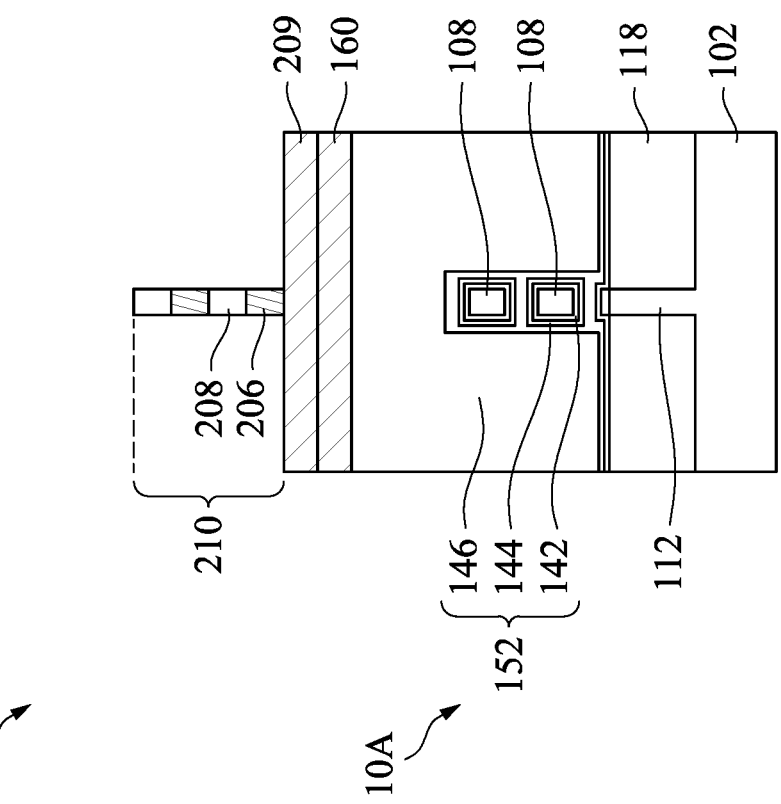
FIGS. 16B, 17B, 18B, 19B, 20B, 21B, 22B, 23B, 24B and 25B are cross-sectional views of manufacturing second semiconductor device over first semiconductor device, which is along C-C line in FIG. 1A, in accordance with some embodiments.

Referring to FIGS. 16A-16C, a fin structure 210 is formed protruding above the second dielectric layer 209. The fin structure 210 is formed by etching trenches in the multilayer stack 204 (see FIG. 15). The second dielectric layer 209 is thus exposed. The fin structure 210 may be patterned in a similar way as the fin structure 110 as discussed previously with regard to FIGS. 2A-2C, and thus the description thereof is omitted herein.

Figure 17A:
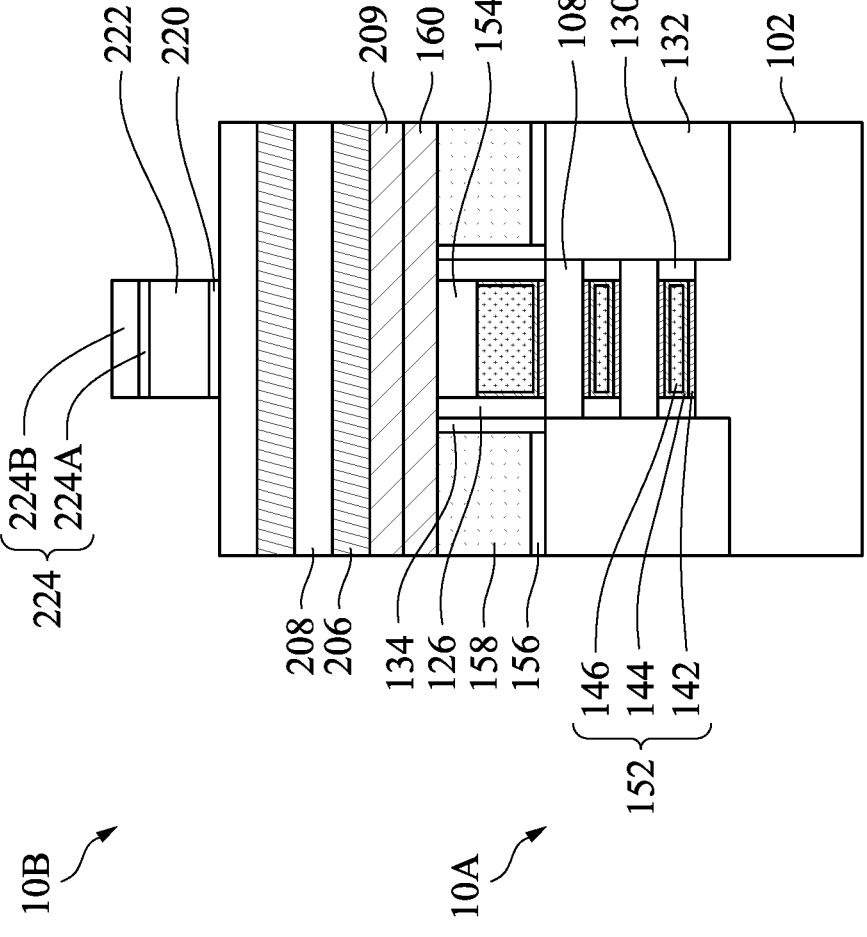
Figure 17C:
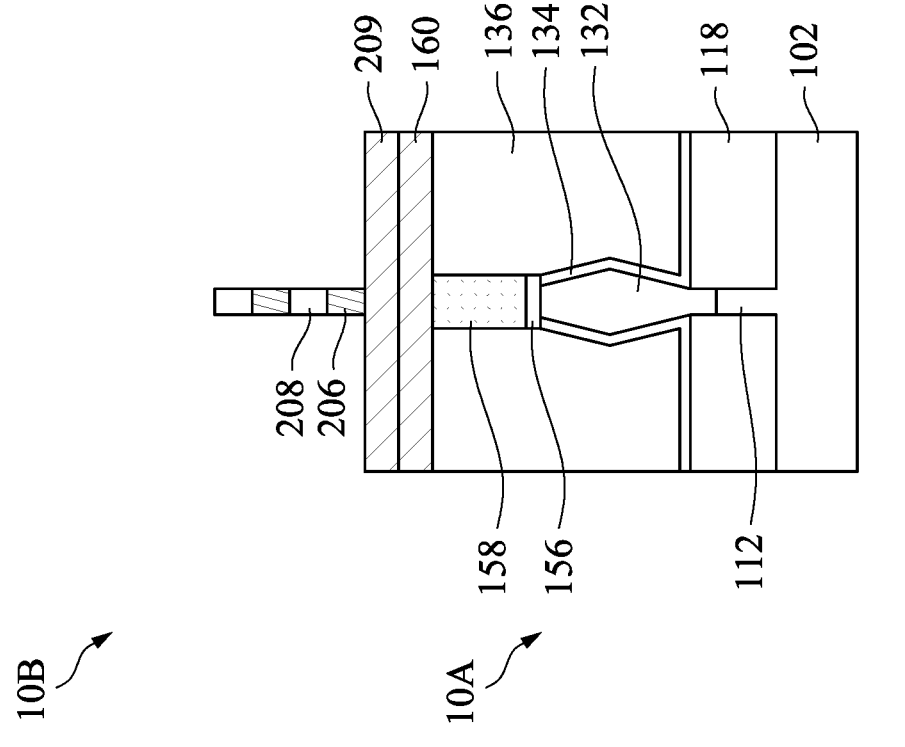
Figure 17B:
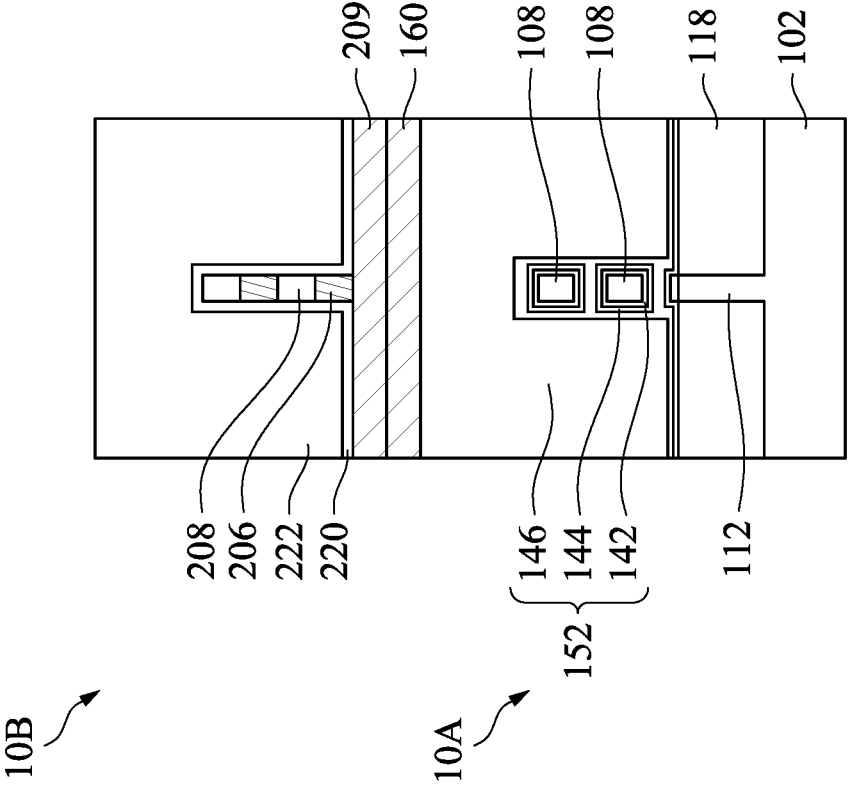
Figure 18A:
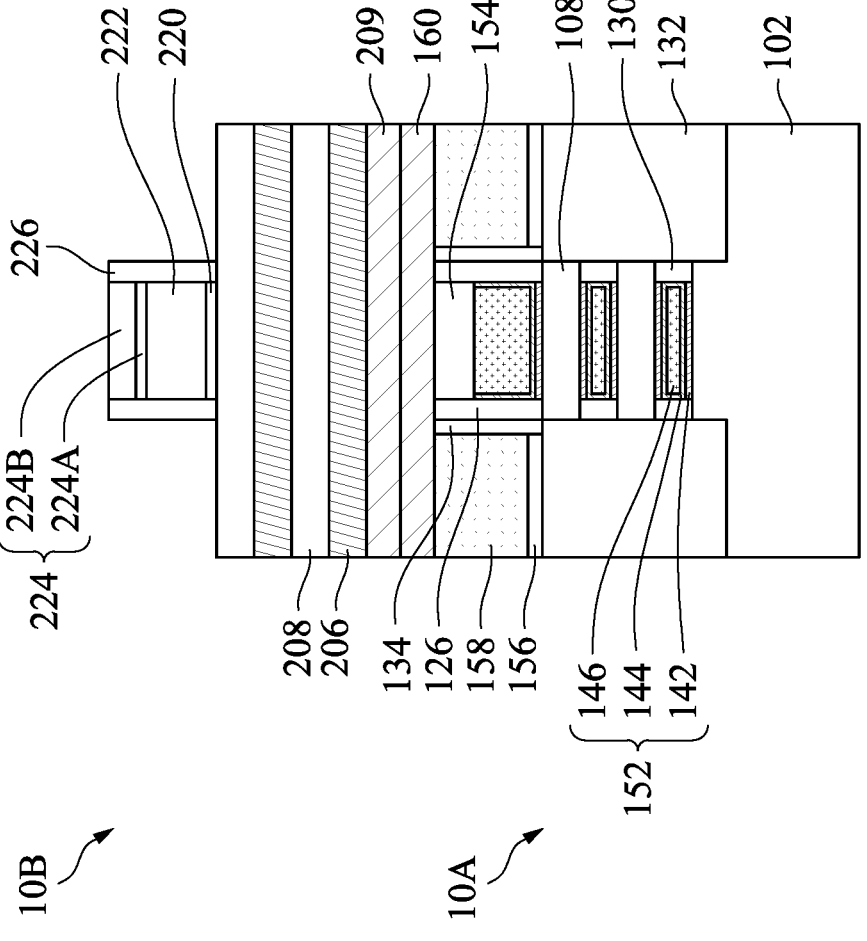
Figure 18C:
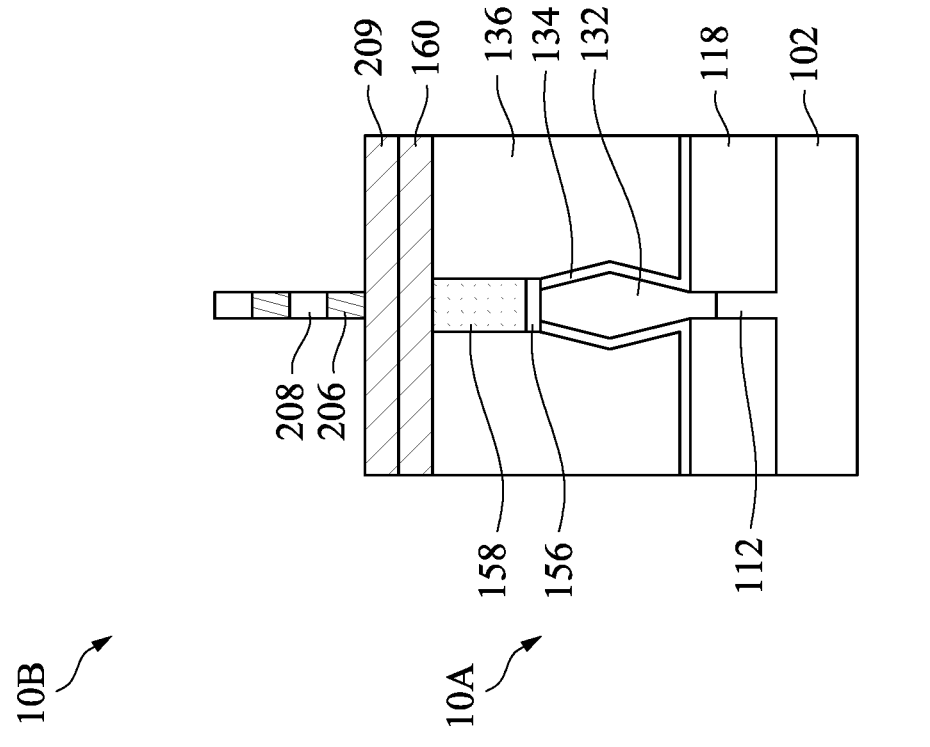
Figure 18B:
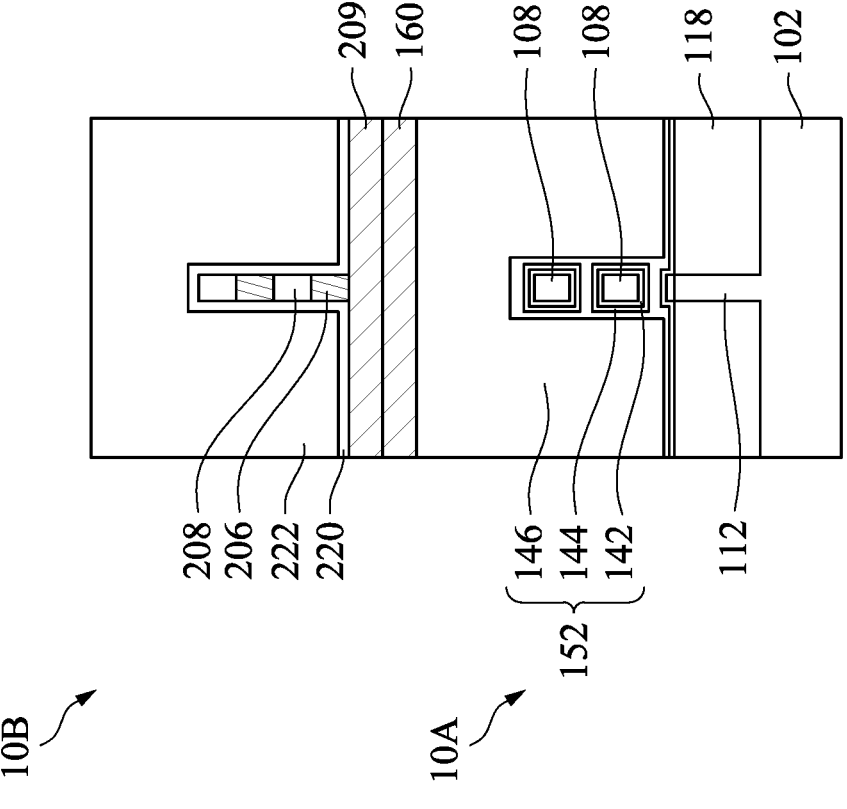

Referring to FIGS. 17A-17C, a dummy gate dielectric 220 and a dummy gate 222 are formed over the fin structure 210 in sequence. The dummy gate dielectric 220 and the dummy gate 222 may be formed by using acceptable photolithography and etching techniques using a mask 224 including a first mask layer 224A and a second mask layer 224B as an etch mask. The dummy gate dielectric 220 and the dummy gate 222 are similar to the dummy gate dielectric 120 and the dummy gate 122 in terms of composition and formation as discussed previously with regard to FIGS. 3A-3C, and thus the description thereof is omitted herein.

A gate spacer layer is formed by conformally depositing an insulating material over the fin structure 210, the dummy gate 222, the dummy gate dielectric 220 and the second dielectric layer 209. The gate spacer layer is then etched by an anisotropic etching process to form gate spacers 226. The anisotropic etching process may remove horizontal portions of the gate spacer layer (e.g., portions over the second dielectric layer 209 and the dummy gate 222), with remaining portions of the gate spacer layer (e.g., along sidewalls of the dummy gate 222 and the dummy gate dielectric 220) forming the gate spacers 226. The gate spacers 226 are similar to the gate spacers 126 in terms of composition as discussed previously with regard to FIGS. 4A-4C, and thus the description thereof is omitted herein.

After the formation of the gate spacers 226, implantation for lightly doped source/drain (LDD) regions (not shown) may be performed. Appropriate type (e.g., p-type or n-type) impurities may be implanted into the exposed fin structures. An anneal process may be used to activate the implanted impurities.

Figure 19A:
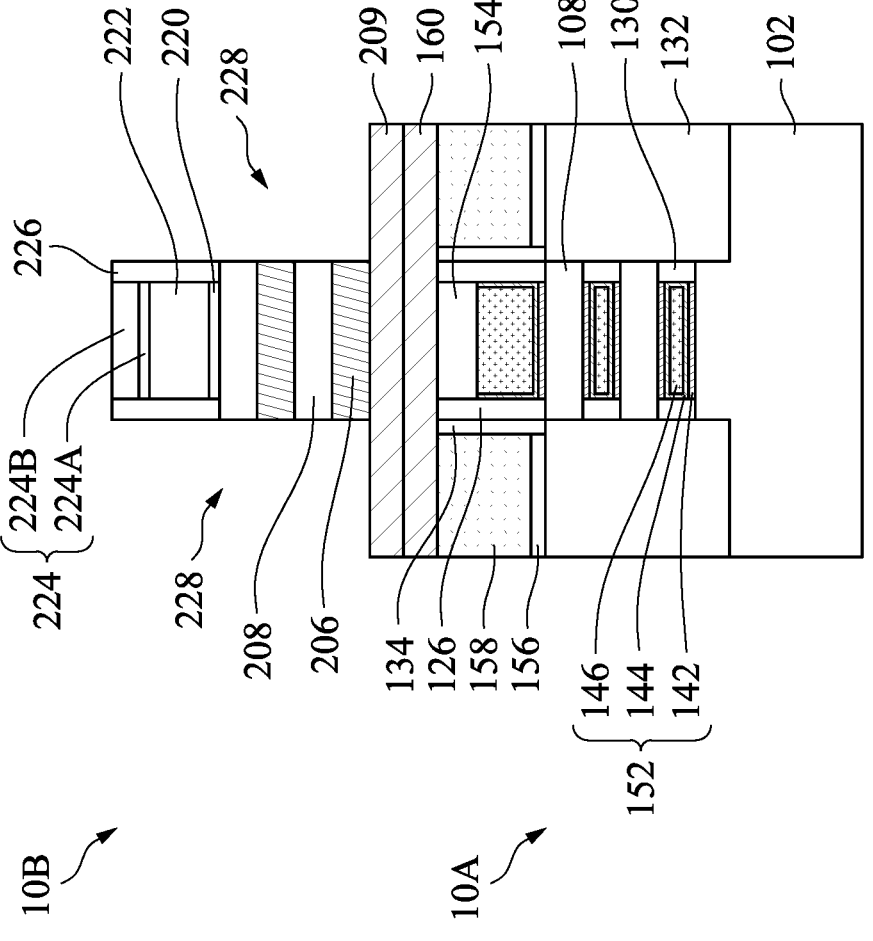
Figures 19B, 19C:
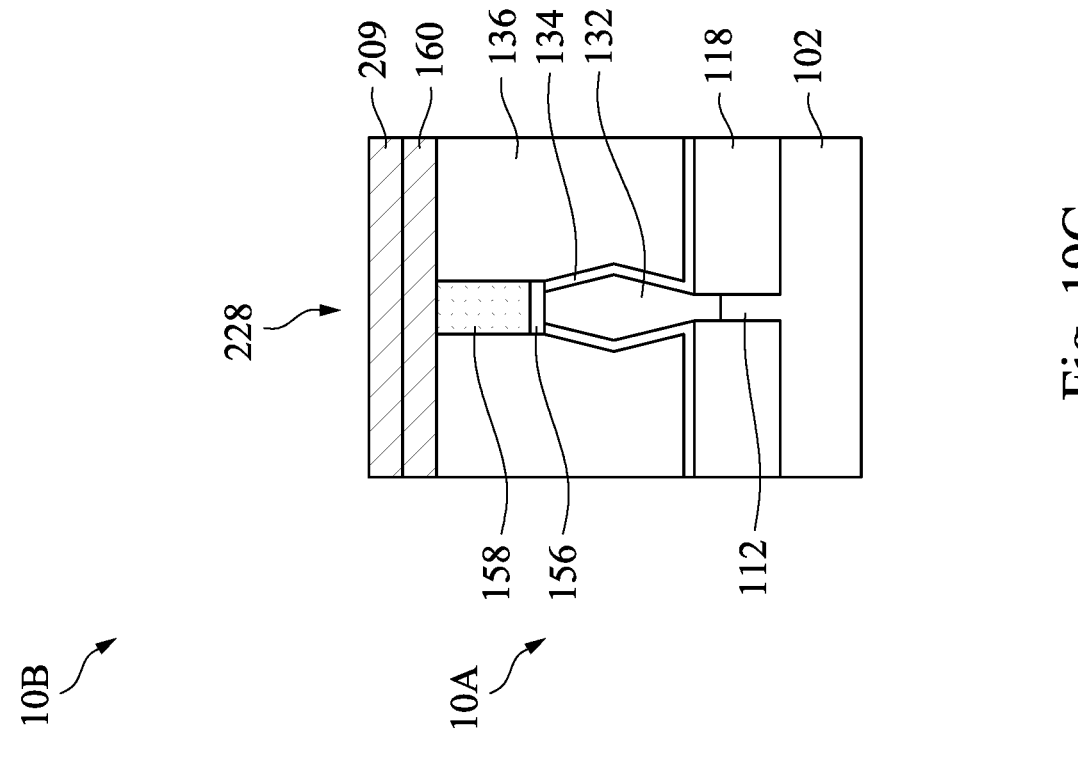

Next, in FIGS. 19A-19C, source/drain recesses 228 are formed in the fin structure 210. The source/drain recesses 228 may extend through the fin structure 210, exposing the second dielectric layer 209. The source/drain recesses 228 may be formed by any acceptable etching technique, using, e.g., the dummy gate 222 as an etching mask. The source/drain recesses 228 exposes end portions of the second sacrificial layers 206 and end portions of the second semiconductor layers 208.

Figure 20A:
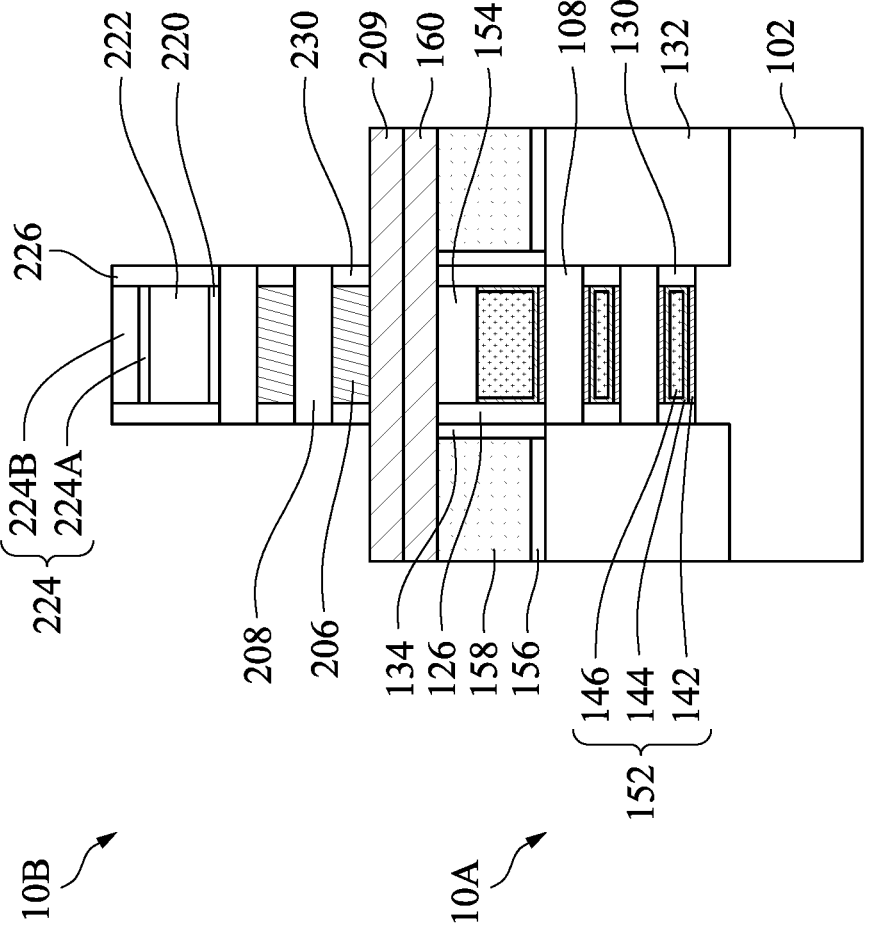
Figure 20C:
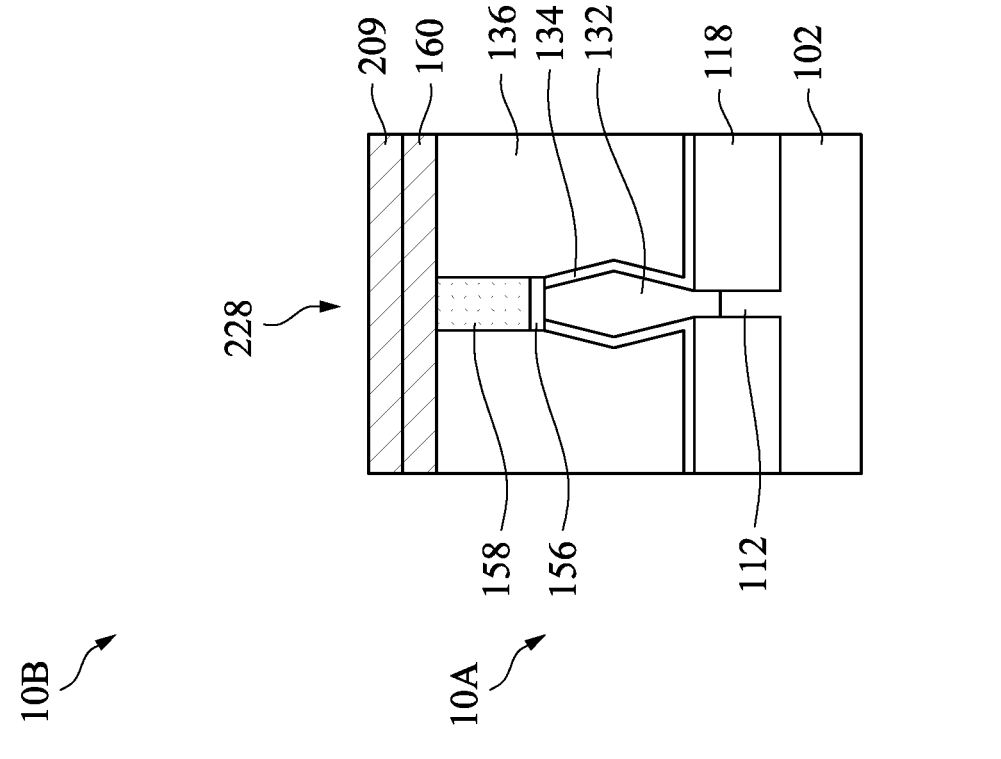
Figure 20B:
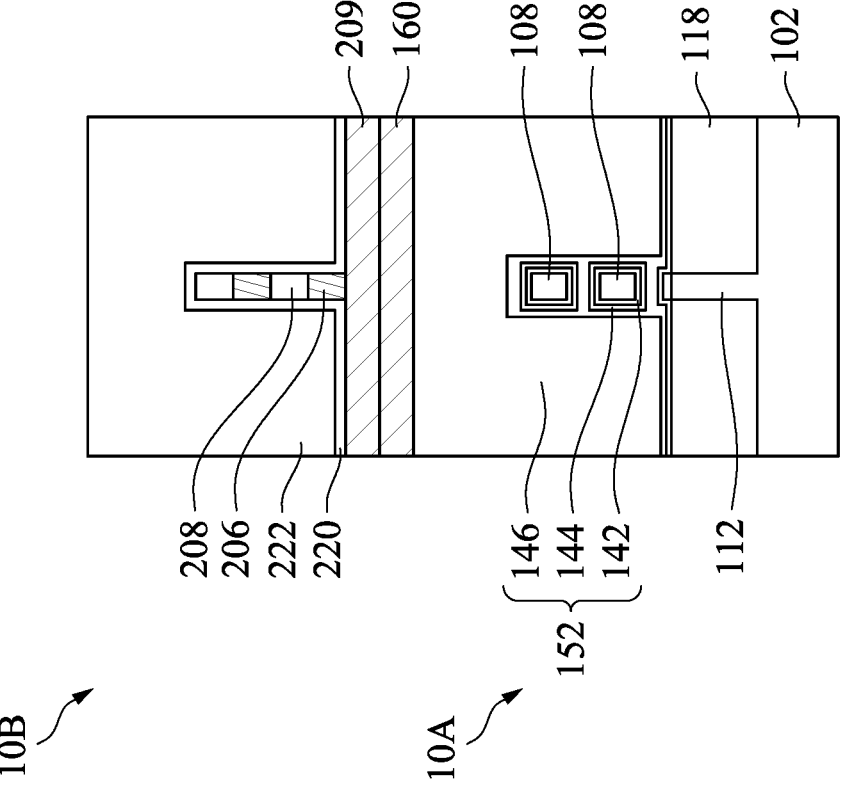

Sidewalls of the layers of the second sacrificial layers 206 exposed by the source/drain recesses 228 are etched to form sidewall recesses between corresponding second semiconductor layers 208. Inner spacers 230 are then formed in the sidewall recesses. The resulting structure is shown in FIGS. 20A-20C. The inner spacers 230 are similar to the inner spacers 130 in terms of composition and formation as discussed previously with regard to FIGS. 7A-7D, and thus the description thereof is omitted herein.

Figure 21A:
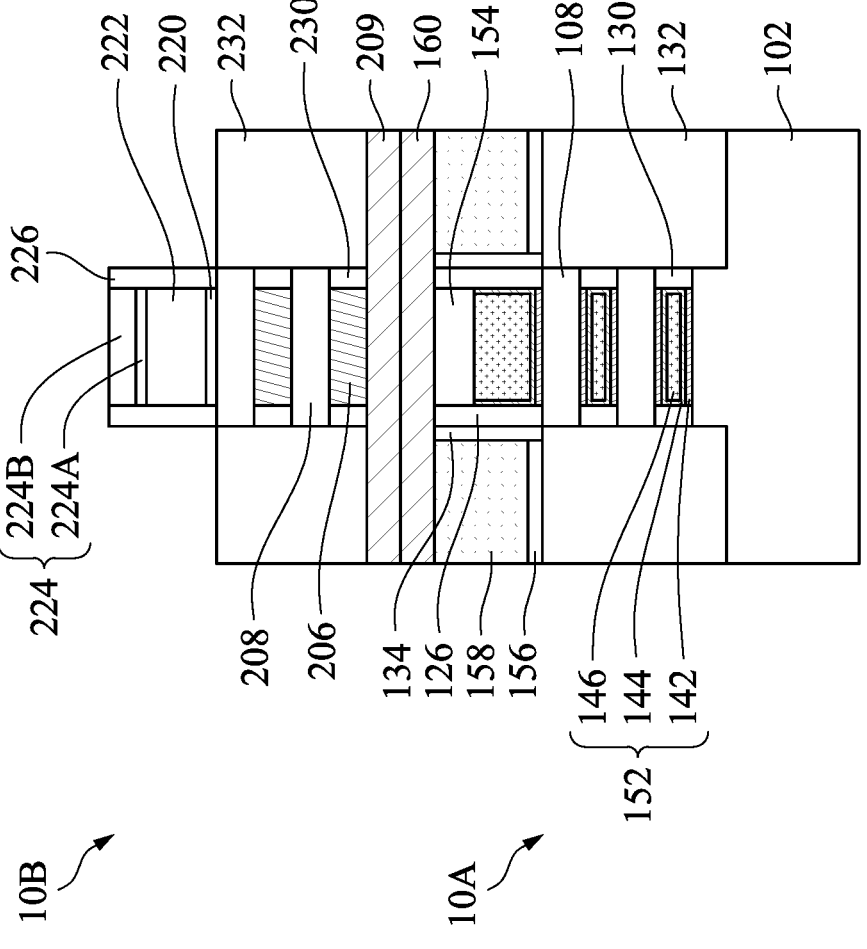
Figure 21C:
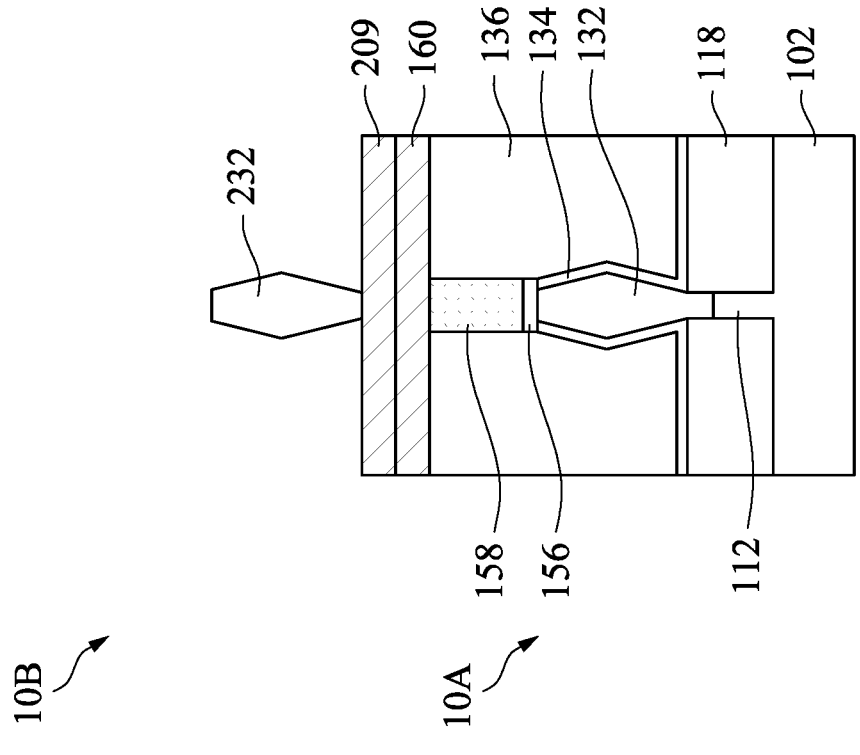
Figure 21B:
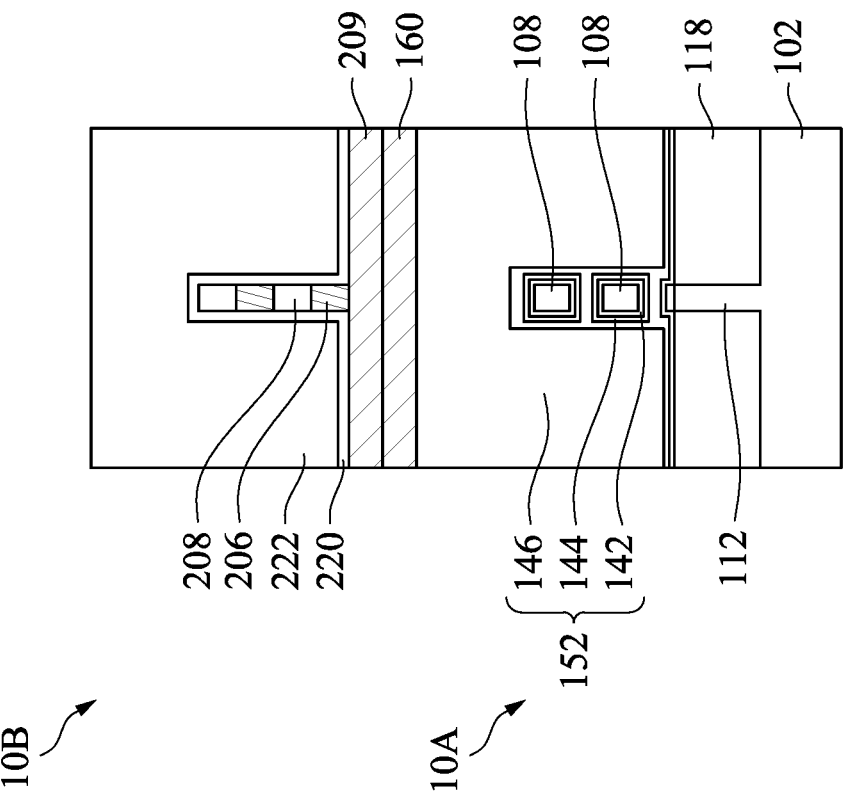

Next, in FIGS. 21A-21C, epitaxial source/drain regions 232 are formed in the source/drain recesses 228. The epitaxial source/drain regions 232 are similar to the epitaxial source/drain regions 232 in terms of composition and formation as discussed previously with regard to FIGS. 8A-8D, and thus the description thereof is omitted herein.

Figure 22A:
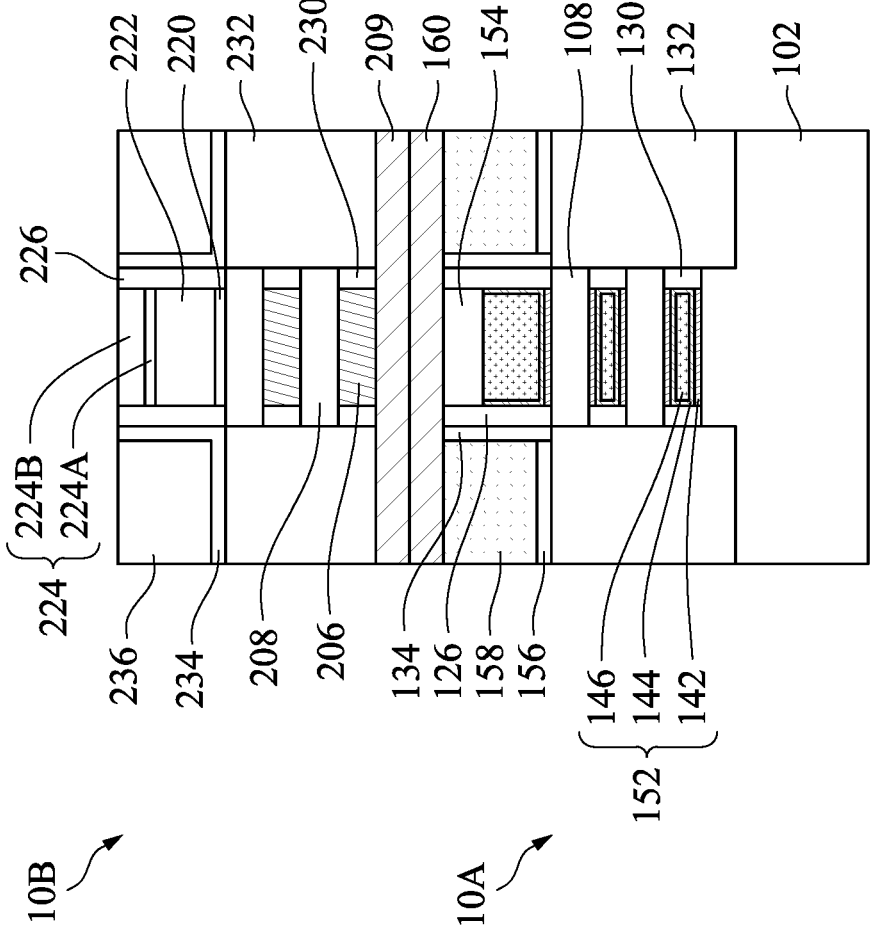
Figure 22C:
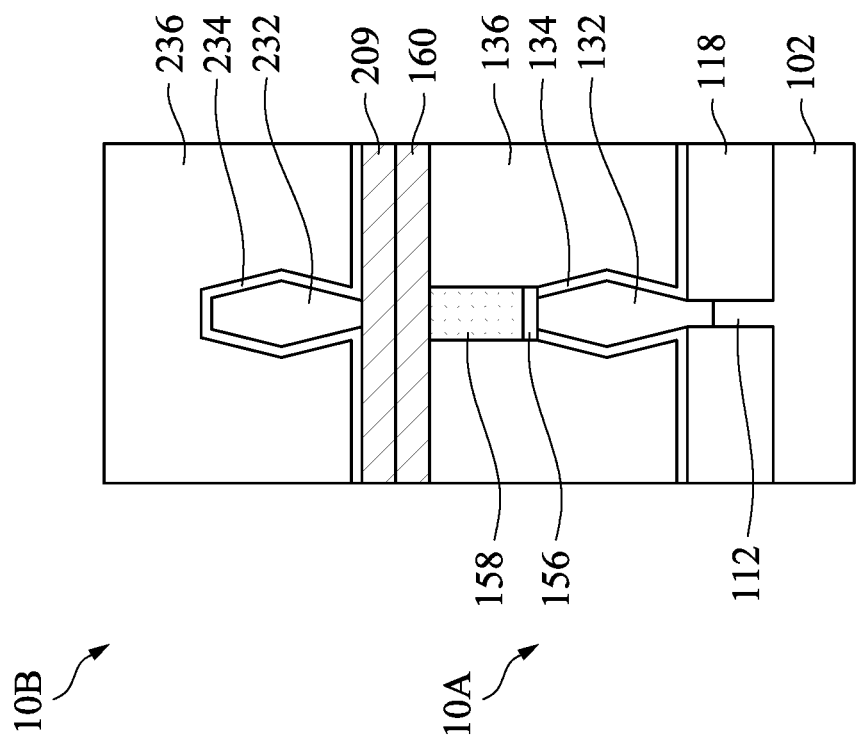
Figure 22B:
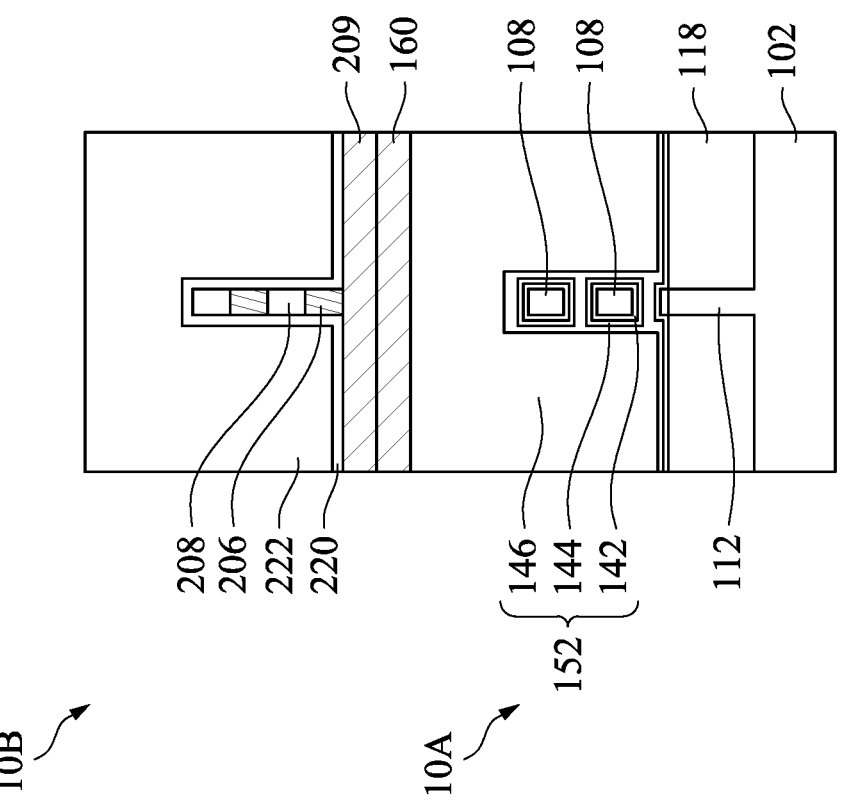

Next, in FIGS. 22A-22C, a contact etch stop layer (CESL) 234 is formed (e.g., conformally) over the epitaxial source/drain regions 232 and over the dummy gate 222, and a first inter-layer dielectric (ILD) 236 is then deposited over the CESL 234. The CESL 234 and the first ILD layer 236 are similar to the CESL 134 and the first ILD layer 136 in terms of composition and formation, respectively, as discussed previously with regard to FIGS. 9A-9D, and thus the description thereof is omitted herein.

Figure 23A:
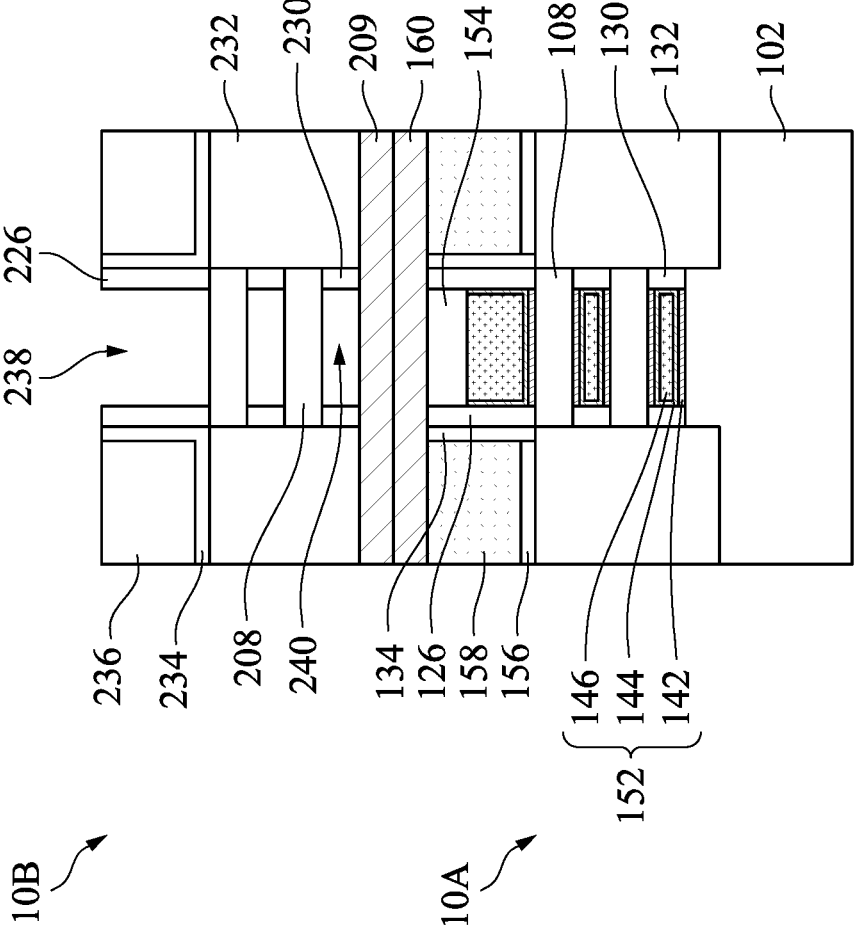
Figure 23C:
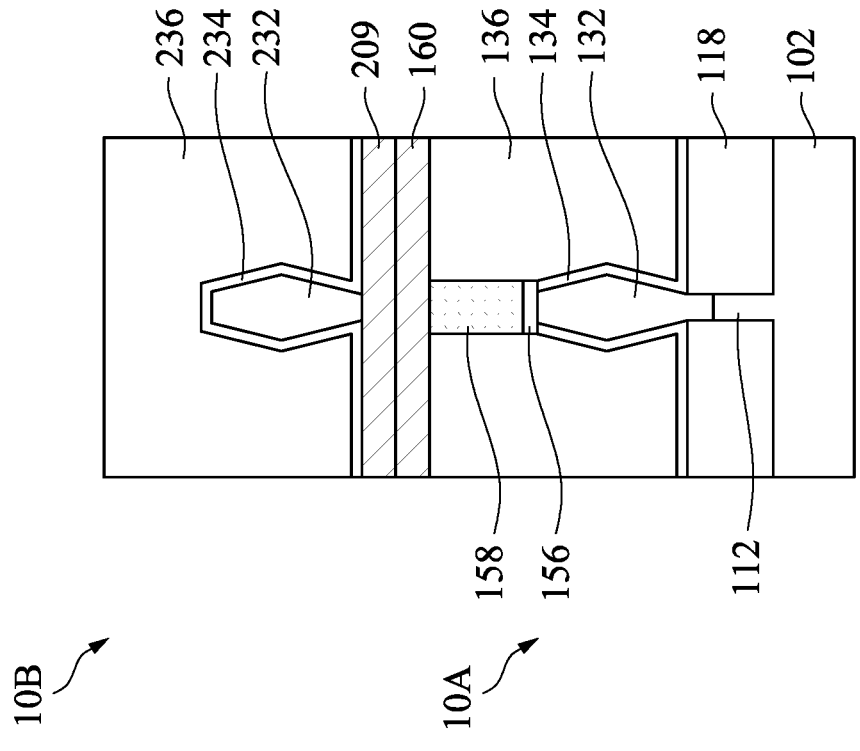
Figure 23B:
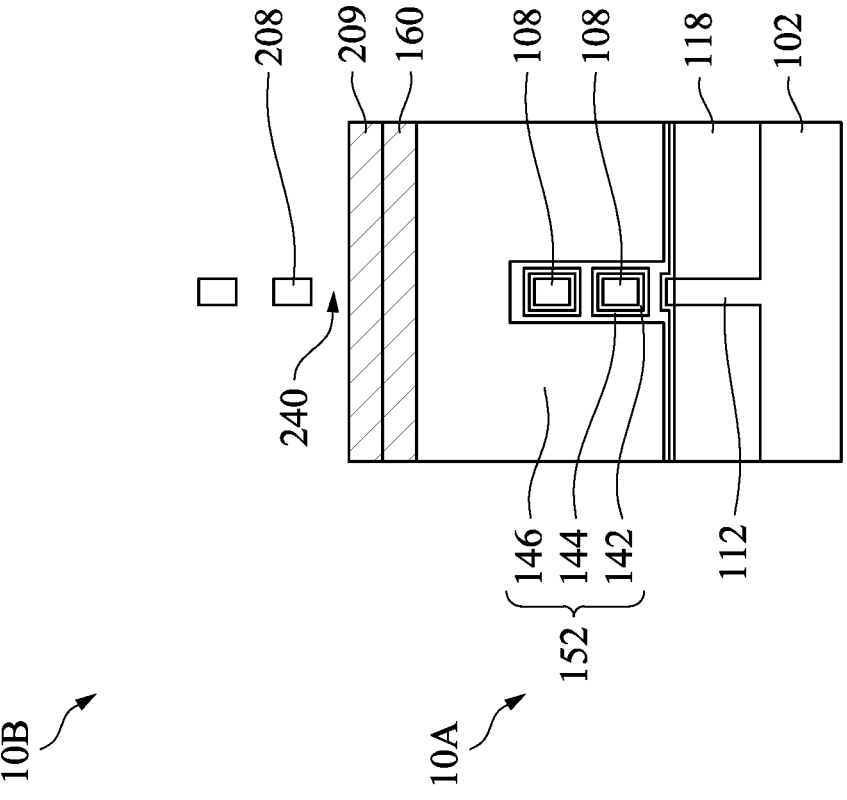

The dummy gate 222 is removed, so that a gate trench 238 (may also be referred to as an opening) is formed between the gate spacers 226. Next, the second sacrificial layers 206 are removed to release the second semiconductor layers 208, as shown in FIGS. 23A-23C. Gaps 240 (e.g., empty spaces) are formed between the second semiconductor layer 208 by the removal of the second sacrificial layers 206. The second sacrificial layers 206 may also be referred to as nanowires, and the second semiconductor device 10B may also be referred to as a gate-all-around (GAA) device, in some embodiments. The removal of the dummy gate 222 and the second sacrificial layer 206 is similar to the removal of the dummy gate 122 and the first sacrificial layer 106 as discussed previously with regard to FIGS. 10A-10D, and thus the description thereof is omitted herein.

Figure 24A:
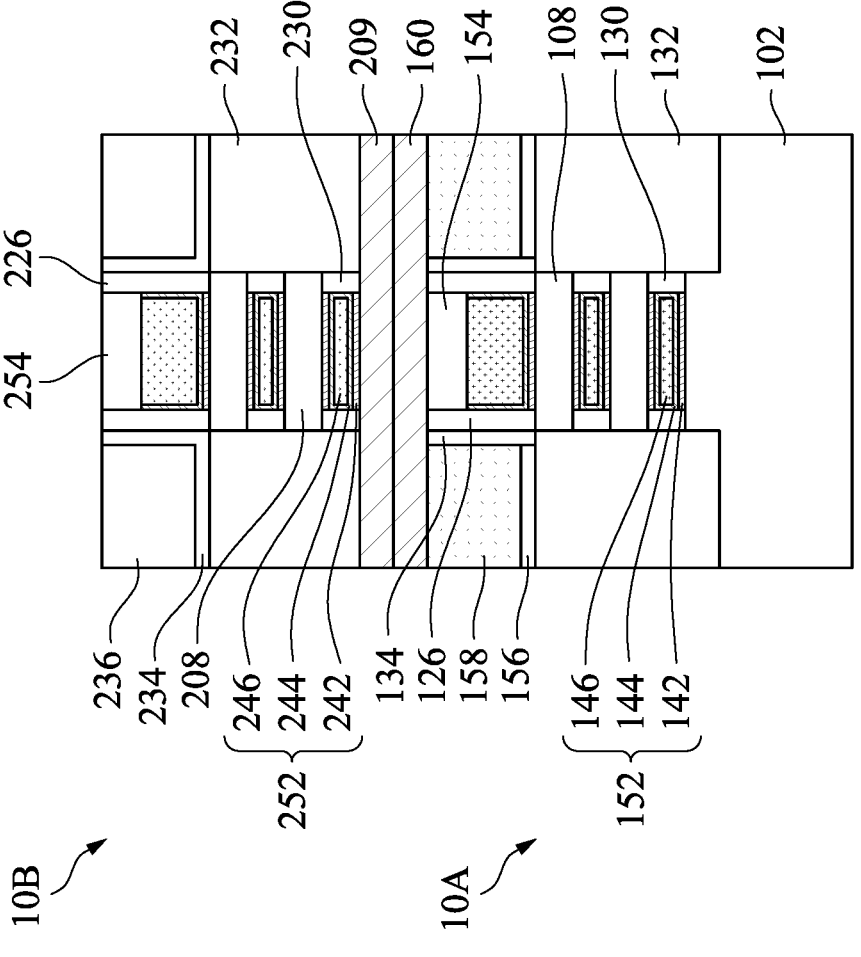
Figure 24C:
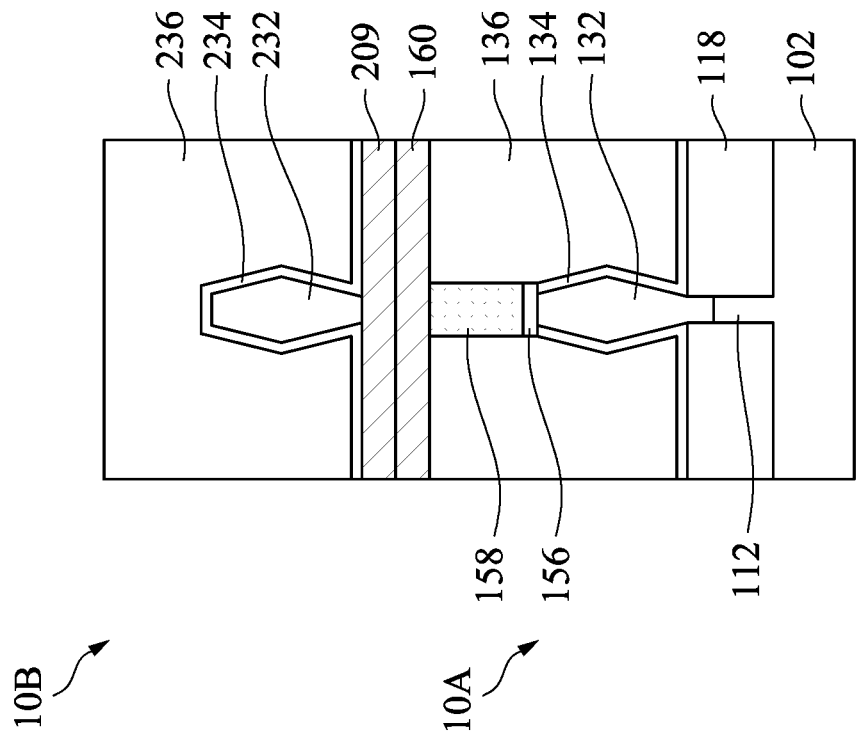
Figure 24B:
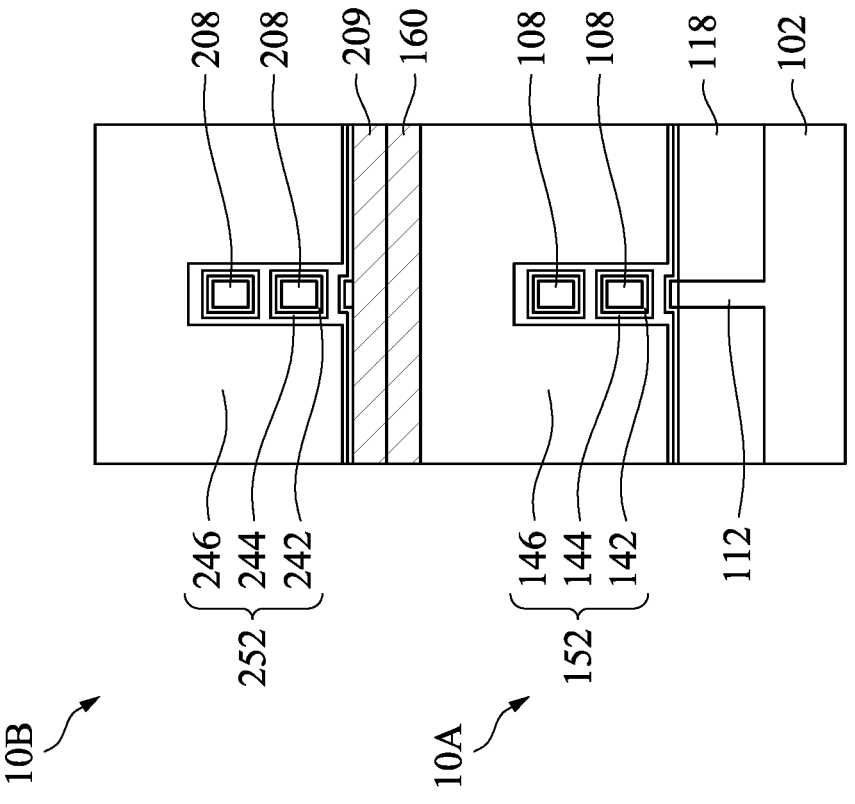

Next, in FIGS. 24A-24C, an interfacial layer 242, a gate dielectric layer 244, a gate electrode 246 including one or more work function layers and a fill metal layer (not separately illustrated) are formed in the gaps 240 and the gate trench 238 in sequence. The gate electrode 246, the gate dielectric layer 244 and the interfacial layer 242 are collectively referred to as a second metal gate structure 252. The gate electrode 246 is recessed, and then a self-aligned contact (SAC) 254 is formed over the gate electrode 246. The formation and the material of the second metal gate structure 252 and the SAC 254 is similar to the first metal gate structure 152 and the SAC 154, respectively, as discussed previously with regard to FIGS. 10A-10D, and thus the description thereof is omitted herein.

Figure 25A:
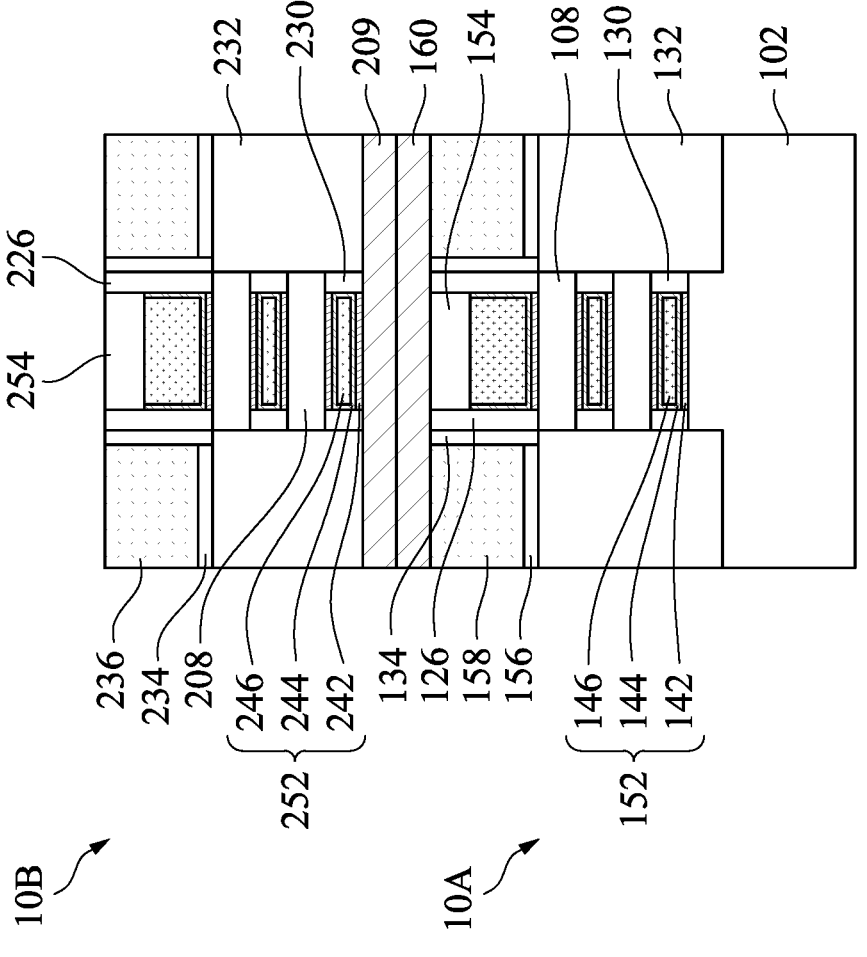
Figure 25C:
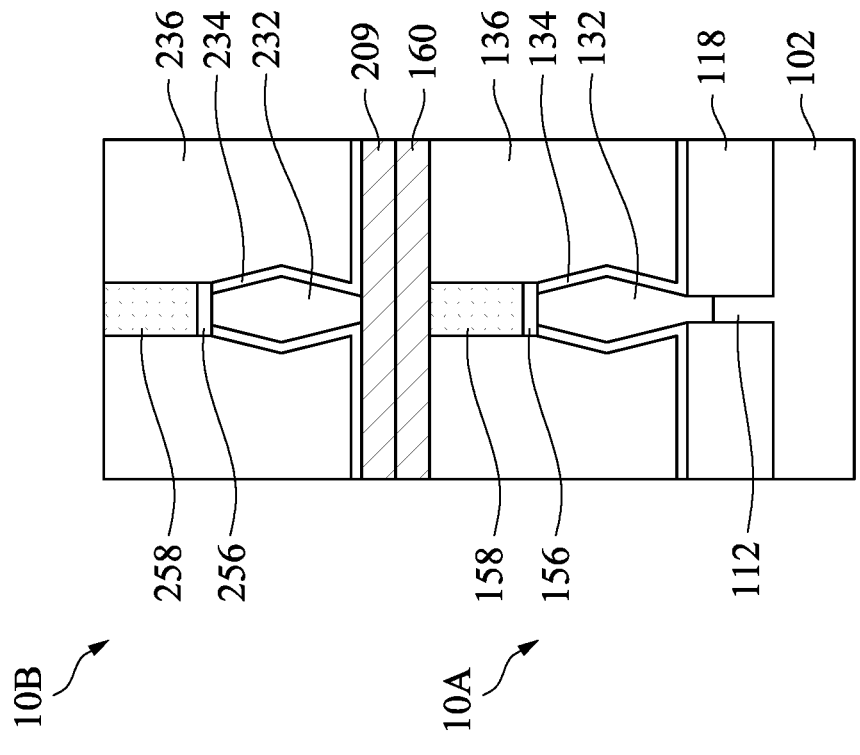
Figure 25B:
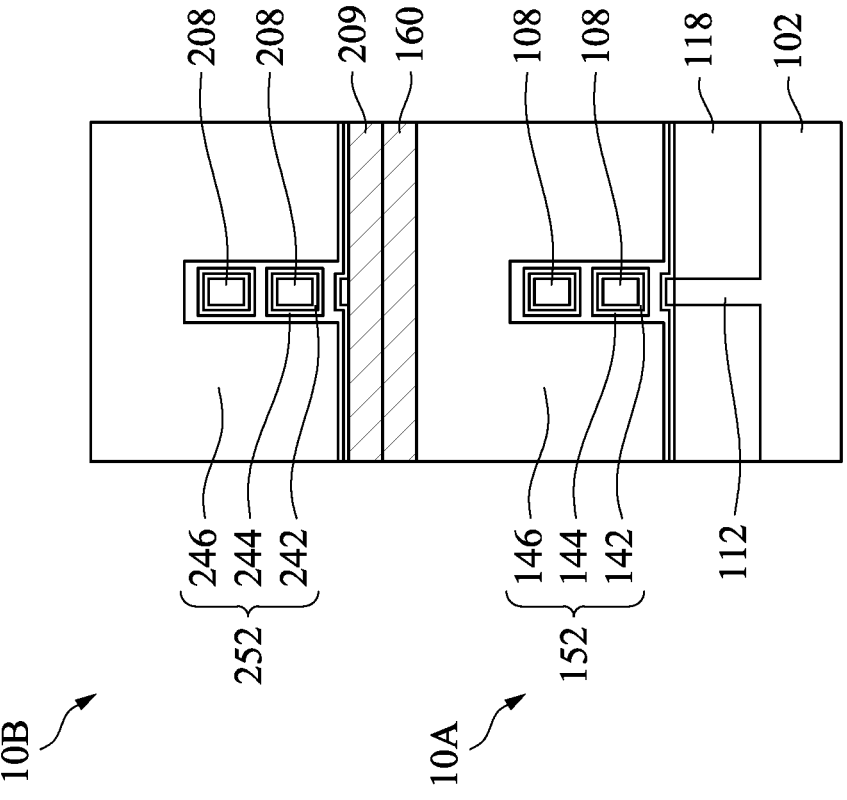

Reference is made to FIGS. 25A-25C. The first ILD layer 236 is removed. The CESL 234 under the first ILD layer 236 is removed, leaving a portion of the CESL 234 extending along opposite sidewalls of the gate spacers 226 and exposing the epitaxial source/drain regions 232. Silicide layers 256 are formed in the recesses over the epitaxial source/drain regions 232 by a silicidation process. Contact plugs 258 are formed filling the recesses by a deposition process and a subsequent planarization process such as CMP. The silicide layers 256 and the contact plugs 258 are similar to the silicide layers 156 and the contact plugs 158 in terms of composition and formation as discussed previously with regard to FIGS. 12A-12D, and thus the description thereof is omitted herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that since the first and second dielectric layers are formed using PEALD but not flowable chemical vapor deposition (FCVD), UV curing or high temperature annealing for bonding FCVD deposited layers is not required. Another advantage is that unwanted oxidation of Ge atoms in the second sacrificial layers and unwanted interdiffusion of Ge atoms between the second sacrificial layers and the second semiconductor layers can be prevented.

In some embodiments, a method includes the following steps. A transistor including a first gate structure is formed on a first substrate. A first dielectric layer is deposited over the transistor using plasma enhanced atomic layer deposition (PEALD). A multilayer stack is formed on a second substrate. The multilayer stack comprises alternately stacked semiconductor layers and sacrificial layers. A second dielectric layer is deposited over the multilayer stack using a plasma enhanced atomic layer deposition (PEALD). The second dielectric layer is bonded with the first dielectric layer. The sacrificial layers are replaced with a second gate structure. In some embodiments, depositing the first dielectric layer is performed at a temperature in a range from 260° C. to 400° C. In some embodiments, the method includes after depositing the first dielectric layer, performing a plasma treatment to the first dielectric layer. In some embodiments, the plasma treatment is performed using $O_2$, $H_2$, $NH_3$, or a combination thereof. In some embodiments, after performing the plasma treatment to the first dielectric layer, the first dielectric layer has a top portion having an oxygen atomic concentration greater than an oxygen atomic concentration of a bottom portion of the first dielectric layer. In some embodiments, after performing the plasma treatment to the first dielectric layer, the first dielectric layer has a top portion having a nitrogen atomic concentration greater than a nitrogen atomic concentration of a bottom portion of the first dielectric layer. In some embodiments, the bonded first and second dielectric layers have a gradient oxygen concentration increasing from a bottom surface of the first dielectric layer to an interface between the first and second dielectric layers. In some embodiments, the gradient oxygen concentration in the bonded first and second dielectric layers decreases from the interface between the first and second dielectric layers to a top surface of the second dielectric layer.

In some embodiments, a method includes the following steps. A first transistor is formed over a substrate. A first bonding dielectric layer is formed over the first transistor. The first bonding dielectric layer is treated to form silanol bonds within the first bonding dielectric layer. After treating the first bonding dielectric layer, a multilayer stack is bonded to the first bonding dielectric layer using a second bonding dielectric layer. A second transistor is formed using one or more semiconductor layers in the multilayer stack. In some embodiments, the method further comprises treating the second bonding dielectric layer to form silanol bonds within the second bonding dielectric layer. In some embodiments, the second bonding dielectric layer is treated using $O_2$ plasma, $H_2$ plasma, $NH_3$ plasma, or a combination thereof. In some embodiments, the first bonding dielectric layer is treated using $O_2$ plasma, $H_2$ plasma, $NH_3$ plasma, or a combination thereof. In some embodiments, forming the first bonding dielectric layer is performed at a temperature in a range from 260° C. to 400° C.

In some embodiments, a semiconductor device comprises first semiconductor channels, a first gate, a first dielectric layer, a second dielectric layer, second semiconductor channels and a second gate. The first semiconductor channels extend in a first direction above a first substrate. The first gate wraps around the first semiconductor channels. The first dielectric layer is over the first gate. The first dielectric layer has a top portion and a bottom portion having different compositions. The second dielectric layer is in contact with the first dielectric layer. The second semiconductor channels extend in the first direction above the first substrate. The second gate wraps around the second semiconductor channels. In some embodiments, the top portion of the first dielectric layer has an oxygen atomic concentration different from an oxygen atomic concentration of the bottom portion of the first dielectric layer. In some embodiments, the top portion of the first dielectric layer has an oxygen atomic concentration greater than an oxygen atomic concentration of the bottom portion of the first dielectric layer. In some embodiments, the top portion of the first dielectric layer has a nitrogen atomic concentration different from a nitrogen concentration of the bottom portion of the first dielectric layer. In some embodiments, the top portion of the first dielectric layer has a nitrogen atomic concentration greater than a nitrogen concentration of the bottom portion of the first dielectric layer. In some embodiments, the second dielectric layer has a top portion and a bottom portion having different compositions. In some embodiments, the first dielectric layer and the second dielectric layer are silicon oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a transistor including a first gate structure on a first substrate;
   depositing a first dielectric layer over the transistor using plasma enhanced atomic layer deposition (PEALD);
   forming a multilayer stack on a second substrate, the multilayer stack comprising alternately stacked semiconductor layers and sacrificial layers;
   depositing a second dielectric layer over the multilayer stack using a plasma enhanced atomic layer deposition (PEALD);
   bonding the second dielectric layer with the first dielectric layer; and
   replacing the sacrificial layers with a second gate structure.

2. The method of claim 1, wherein depositing the first dielectric layer is performed at a temperature in a range from 260° C. to 400° C.

3. The method of claim 1, further comprising:
   after depositing the first dielectric layer, performing a plasma treatment to the first dielectric layer.

4. The method of claim 3, wherein the plasma treatment is performed using $O_2$, $H_2$, $NH_3$, or a combination thereof.

5. The method of claim 3, wherein after performing the plasma treatment to the first dielectric layer, the first dielectric layer has a top portion having an oxygen atomic concentration greater than an oxygen atomic concentration of a bottom portion of the first dielectric layer.

6. The method of claim 3, wherein after performing the plasma treatment to the first dielectric layer, the first dielectric layer has a top portion having a nitrogen atomic concentration greater than a nitrogen atomic concentration of a bottom portion of the first dielectric layer.

7. The method of claim 1, wherein the bonded first and second dielectric layers have a gradient oxygen concentration increasing from a bottom surface of the first dielectric layer to an interface between the first and second dielectric layers.

8. The method of claim 7, wherein the gradient oxygen concentration in the bonded first and second dielectric layers decreases from the interface between the first and second dielectric layers to a top surface of the second dielectric layer.

9. A method, comprising:
   forming a first transistor over a substrate;

forming a first bonding dielectric layer over the first transistor;

treating the first bonding dielectric layer to form silanol bonds within the first bonding dielectric layer;

after treating the first bonding dielectric layer, bonding a multilayer stack to the first bonding dielectric layer using a second bonding dielectric layer; and forming a second transistor using one or more semiconductor layers in the multilayer stack.

10. The method of claim 9, further comprising:

treating the second bonding dielectric layer to form silanol bonds within the second bonding dielectric layer.

11. The method of claim 10, wherein the second bonding dielectric layer is treated using $O_2$ plasma, $H_2$ plasma, $NH_3$ plasma, or a combination thereof.

12. The method of claim 9, wherein the first bonding dielectric layer is treated using $O_2$ plasma, $H_2$ plasma, $NH_3$ plasma, or a combination thereof.

13. The method of claim 9, wherein forming the first bonding dielectric layer is performed at a temperature in a range from 260° C. to 400° C.

14. A method, comprising:

forming first semiconductor channels extending in a first direction above a first substrate;

forming a first gate wrapping around the first semiconductor channels;

forming a first dielectric layer over the first gate, wherein the first dielectric layer has a top portion and a bottom portion having different compositions;

forming a second dielectric layer in contact with the first dielectric layer;

forming second semiconductor channels extending in the first direction above the first substrate; and forming a second gate wrapping around the second semiconductor channels.

15. The method of claim 14, wherein the top portion of the first dielectric layer has an oxygen atomic concentration different from an oxygen atomic concentration of the bottom portion of the first dielectric layer.

16. The method of claim 14, wherein the top portion of the first dielectric layer has an oxygen atomic concentration greater than an oxygen atomic concentration of the bottom portion of the first dielectric layer.

17. The method of claim 14, wherein the top portion of the first dielectric layer has a nitrogen atomic concentration different from a nitrogen concentration of the bottom portion of the first dielectric layer.

18. The method of claim 14, wherein the top portion of the first dielectric layer has a nitrogen atomic concentration greater than a nitrogen concentration of the bottom portion of the first dielectric layer.

19. The method of claim 14, wherein the second dielectric layer has a top portion and a bottom portion having different compositions.

20. The method of claim 14, wherein the first dielectric layer and the second dielectric layer are silicon oxide.

* * * * *